(12) United States Patent
Shepard et al.

(10) Patent No.: US 9,704,956 B2
(45) Date of Patent: Jul. 11, 2017

(54) ELECTRICAL DEVICES WITH GRAPHENE ON BORON NITRIDE

(71) Applicant: THE TRUSTEES OF COLUMBIA UNIVERSITY IN THE CITY OF NEW YORK, New York, NY (US)

(72) Inventors: Kenneth Shepard, Ossing, NY (US); Philip Kim, New York, NY (US); James C. Hone, New York, NY (US); Cory Dean, New York, NY (US)

(73) Assignee: The Trustees of Columbia University in the city of New York, New York, NY (US)

( * ) Notice: Subject to any disclaimer, the term of this patent is extended or adjusted under 35 U.S.C. 154(b) by 0 days.

(21) Appl. No.: 14/989,470

(22) Filed: Jan. 6, 2016

(65) Prior Publication Data

US 2016/0197148 A1 Jul. 7, 2016

Related U.S. Application Data

(62) Division of application No. 13/996,214, filed as application No. PCT/US2011/066620 on Dec. 21, 2011, now Pat. No. 9,257,509.

(Continued)

(51) Int. Cl.
*H01L 29/16* (2006.01)
*H01L 29/51* (2006.01)
(Continued)

(52) U.S. Cl.
CPC ...... *H01L 29/1606* (2013.01); *H01L 29/0665* (2013.01); *H01L 29/1033* (2013.01); *H01L 29/42356* (2013.01); *H01L 29/518* (2013.01); *H01L 29/66742* (2013.01); *H01L 29/778* (2013.01); *H01L 29/78603* (2013.01); *H01L 29/78684* (2013.01)

(58) Field of Classification Search
CPC ........... H01L 29/1606; H01L 29/66015; H01L 29/66472; H01L 29/0665; H01L 29/87603; H01L 29/78603; H01L 29/78684; H01L 2924/10325
USPC ........ 257/288, 368, 369; 438/151, 478, 197, 438/199; 977/734, 742
See application file for complete search history.

(56) References Cited

U.S. PATENT DOCUMENTS 4,551,195 A 11/1985 Iizuka et al.
7,601,322 B2 10/2009 Huang
(Continued)

FOREIGN PATENT DOCUMENTS

EP 1246211 A2 10/2002
WO WO 97/42800 A1 11/1997
(Continued)

OTHER PUBLICATIONS

U.S. Appl. No. 13/996,214, Dec. 22, 2015 Issue Fee Payment.
(Continued)

*Primary Examiner* — Jarrett Stark
*Assistant Examiner* — Shahed Ahmed
(74) *Attorney, Agent, or Firm* — Baker Botts LLP

(57) ABSTRACT

Methods of forming and resulting devices are described that include graphene devices on boron nitride. Selected methods of forming and resulting devices include graphene field effect transistors (GFETs) including boron nitride.

9 Claims, 19 Drawing Sheets

Related U.S. Application Data

(60) Provisional application No. 61/425,636, filed on Dec. 21, 2010.

(51) Int. Cl.
*H01L 29/778* (2006.01)
*H01L 29/06* (2006.01)
*H01L 29/66* (2006.01)
*H01L 29/786* (2006.01)
*H01L 29/10* (2006.01)
*H01L 29/423* (2006.01)

(56) References Cited

U.S. PATENT DOCUMENTS

| | | |
|---|---|---|
| 7,619,257 B2 | 11/2009 | Pfeiffer |
| 7,687,841 B2 | 3/2010 | Sandhu |
| 7,781,061 B2 | 8/2010 | Garcia et al. |
| 8,426,309 B2 | 4/2013 | Ward et al. |
| 8,445,893 B2 | 5/2013 | Meric et al. |
| 8,735,209 B2 | 5/2014 | Meric et al. |
| 9,257,509 B2 | 2/2016 | Shepard et al. |
| 2007/0287011 A1 | 12/2007 | DeHeer |
| 2009/0169919 A1 | 7/2009 | Garcia et al. |
| 2009/0227755 A1 | 9/2009 | Devoe et al. |
| 2009/0294759 A1* | 12/2009 | Woo ............... B82Y 10/00 257/29 |
| 2010/0051907 A1* | 3/2010 | Pfeiffer ............. H01L 21/02376 257/29 |
| 2010/0102299 A1 | 4/2010 | Murase et al. |
| 2010/0112773 A1 | 5/2010 | Ting |
| 2010/0127269 A1 | 5/2010 | Daniel et al. |
| 2010/0224851 A1 | 9/2010 | Colombo et al. |
| 2010/0255984 A1 | 10/2010 | Sutter et al. |
| 2011/0017979 A1 | 1/2011 | Meric et al. |
| 2011/0030991 A1 | 2/2011 | Veerasamy |
| 2011/0309336 A1 | 12/2011 | Shin et al. |
| 2011/0315655 A1 | 12/2011 | Asano |
| 2012/0181507 A1 | 7/2012 | Dimitrakopoulos et al. |
| 2012/0329260 A1 | 12/2012 | Avouris et al. |
| 2013/0108540 A1 | 5/2013 | Baek et al. |
| 2013/0134391 A1 | 5/2013 | Afzali-Ardakani et al. |
| 2013/0157034 A1 | 6/2013 | Choi et al. |
| 2014/0099764 A1 | 4/2014 | Meric et al. |

FOREIGN PATENT DOCUMENTS

| | | | |
|---|---|---|---|
| WO | WO 2007/097938 A1 | 8/2007 | |
| WO | WO 2010/006080 A2 | 1/2010 | |
| WO | WO 2012/088334 A1 | 6/2012 | |
| WO | WO 2012/127245 A2 | 9/2012 | |
| WO | WO 2013/096841 A1 | 7/2013 | |

OTHER PUBLICATIONS

U.S. Appl. No. 13/996,214, Oct. 2, 2015 Notice of Allowance.
U.S. Appl. No. 13/996,214, Sep. 4, 2015 Applicant Initiated Interview Summary.
U.S. Appl. No. 13/996,214, Sep. 1, 2015 Amendment and Request for Continued Examination (RCE).
U.S. Appl. No. 13/996,214, May 1, 2015 Final Office Action.
U.S. Appl. No. 13/996,214, Mar. 5, 2015 Applicant Initiated Interview Summary.
U.S. Appl. No. 13/996,214, Mar. 2, 2015 Response to Non-Final Office Action.
U.S. Appl. No. 13/996,214, Oct. 29, 2014 Non-Final Office Action.
U.S. Appl. No. 13/996,214, Sep. 29, 2014 Response to Restriction Requirement.
U.S. Appl. No. 13/996,214, Jul. 29, 2014 Restriction Requirement Filed.
"U.S. Appl. No. 12/839,095, Non Final Office Action mailed Aug. 6, 2012", 9 pgs.
"U.S. Appl. No. 12/839,095, Notice of Allowance mailed Dec. 26, 2012", 7 pgs.
"U.S. Appl. No. 12/839,095, PTO Response to 312 Communication mailed Apr. 4, 2013", 2 pgs.
"U.S. Appl. No. 12/839,095, Response filed Jun. 25, 2012 to Restriction Requirement mailed Apr. 26, 2012".
"U.S. Appl. No. 12/839,095, Response filed Dec. 6, 2012 to Non-Final Office Action mailed Aug. 6, 2012", 8 pgs.
"U.S. Appl. No. 12/839,095, Restriction Requirement mailed Apr. 26, 2012", 5 pgs.
"U.S. Appl. No. 13/838,001, Non Final Office Action mailed Jul. 19, 2013", 9 pgs.
"U.S. Appl. No. 13/838,001, Notice of Allowance mailed Jan. 16, 2014", 7 pgs.
"U.S. Appl. No. 13/838,001, Response filed Dec. 16, 2013 to Non Final Office Action mailed Jul. 19, 2013", 11 pgs.
"International Application Serial No. PCT/US2011/066620, International Preliminary Report on Patentability mailed Jul. 4, 2013", 8 pgs.
"International Application Serial No. PCT/US2011/066620, Search Report mailed May 21, 2012", 2 pgs.
"International Application Serial No. PCT/US2011/066620, Written Opinion mailed May 21, 2012", 6 pgs.
Blake, et al., "Graphene-Based Liquid Crystal Device", vol. 8, No. 6, (2008), 1704-1708.
Chandrasekhar, Venkat, et al., "Thermoelectric Applications of Carbon-Based Nanomaterials", [Online]. Retrieved from the Internet:<:http://isen.northwestern.edu/doc/pdf/Booster_VChandrasekhar.Mar10_Final.NarrativeReport.pdf>, (Mar. 2010), 3 pgs.
Chen et al., "Intrinsic and extrinsic performance limits of graphene devices on Si02.", Nat Nanotechnol., 3(4), (Apr. 2008), 206-9.
Dean et al., "Boron nitride substrates for high quality graphene electronics", 5 pgs.
Dean et al., "Boron nitride substrates for high quality graphene electronics: Supplementary Information", 8 pgs.
Dean et al., "Boron Nitride Substrates for High-Quality Graphene Electronics", [Online]. Retrieved from the Internet:<:http://hone.mech.columbia.edu/pdf/cory_mano_2010.pdf>, (Aug. 22, 2010), 7 pgs.
Geim et al., "The rise of graphene", Nature Materials, 6, (Mar. 2007), 183-191.
Giovannetti et al., "Substrate-induced band gap in graphene on hexagonal boron nitride: Ab initio density functional calculations", Physical Review B, 76, (2007), 073103.
Gu et al., "Field effect in epitaxial graphene on a silicon carbide substrate", Appl. Phys. Lett., 90, (2007), 253507.
Javey et al., "Ballistic carbon nanotube field-effect transistors.", Nature, 424(6949), 1 Aug. 7, 2003), 654-7.
Jin et al., "Pentacene OTFTs with PVA Gate Insulators on a Flexible Substrate", J. Korean Phys. Soc., 44, (Jan. 2004), 181-184.
Kim et al., "Realization of a high mobility dual-gated graphene field-effect transistor with Al203 dielectric", Appl. Phvs. Lett., 94, (2009), 062107(1-3).
Lemme et al., "A Graphene Field-Effect Device", IEEE Electron Device Letters, 28(4), (2007), 282-284.
Lin et al., "100-GHz Transistors from Wafer-Scale Epitaxial Graphene", Science, 327(5966), (Feb. 5, 2010), 662.
Meric et al., "Current saturation in zero-bandgap, top-gated graphene field-effect transistors.", Nat Nanotechnol., 3(11), (Nov. 2008), 654-9.
Ozyilmaz et al., "Electronic Transport and Quantum Hall Effect in Bipolar Graphene p-n-p Junctions", Phys. Rev. Lett. 99(16), (2007), 166804(1-4).
Shang et al., "Electrical characterization of germanium p-channel MOSFETs", IEEE Electron Device Letters, 24(4), (Apr. 2003), 242-244.
Shi et al., "Synthesis of Few-Layer Hexagonal Boron Nitride Thin Film by Chemical Vapor Deposition", 2010 American Chemical Society, [Online]. Retrieved from the Internet:<:http://idv.sinica.edu.tw/lanceli/Paper%20PDF/Synthesis%20of%20FewLayer

(56) References Cited

OTHER PUBLICATIONS

%20Hexagonal%20Boron%Nitride%20Thin%20Film%20Chemical%20Vapor%20Deposition.pdf>, (Sep. 2, 2010), 4134-4139.

Tnas et al., "Room-temperature transistor based on a single carbon nanotube", Nature, 393(6680), (May 7, 1998), 49-52.

Wang et al., "Atomic layer deposition of metal oxides on pristine and functionalized graphene.", J Am Chem Soc., 130(26), (Jul. 2, 2008), 8152-3.

Watanabe et al., "Direct-bandgap properties and evidence for ultraviolet lasing of hexagonal boron nitride single crystal", Nature Materials, 3, (Jun. 2004), 404-409.

Williams et al., "Quantum Hall effect in a gate-controlled p-n junction of graphene", Science, 317(5838), (Aug. 3, 2007), 638-41.

Wind et al., "Vertical scaling of carbon nanotube field-effect transistors using top gate electrodes", Appl. Phys. Lett., 80, (2002), 3817-3819.

Wu, et al., "Top-gated graphene field-effect-transistors formed by decomposition of SiC", Appl. Phys. Lett., 92, (2008), 092102.

Ye et al., "GaAs MOSFET with oxide gate dielectric grown by atomic layer deposition", IEEE Electron Device Letters, 24(4), (Apr. 2003), 209-211.

U.S. Appl. No. 15/016,933, filed Feb. 5, 2016.

International Search Report dated Nov. 20, 2014 in International Application No. PCT/US2014/050580.

Kan et al., "Half-Metallicity in Edge-Modified Zigzag Graphene Nanoribbons," J. Am. Chem. Soc., 2008, 130 (13), pp. 4224-4225.

\* cited by examiner

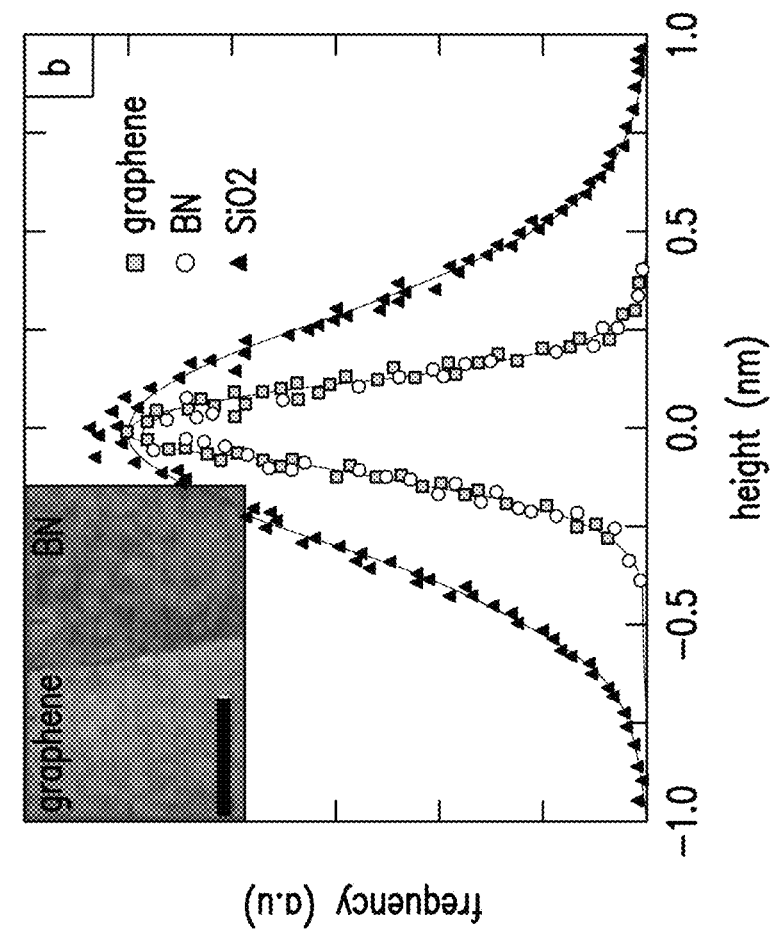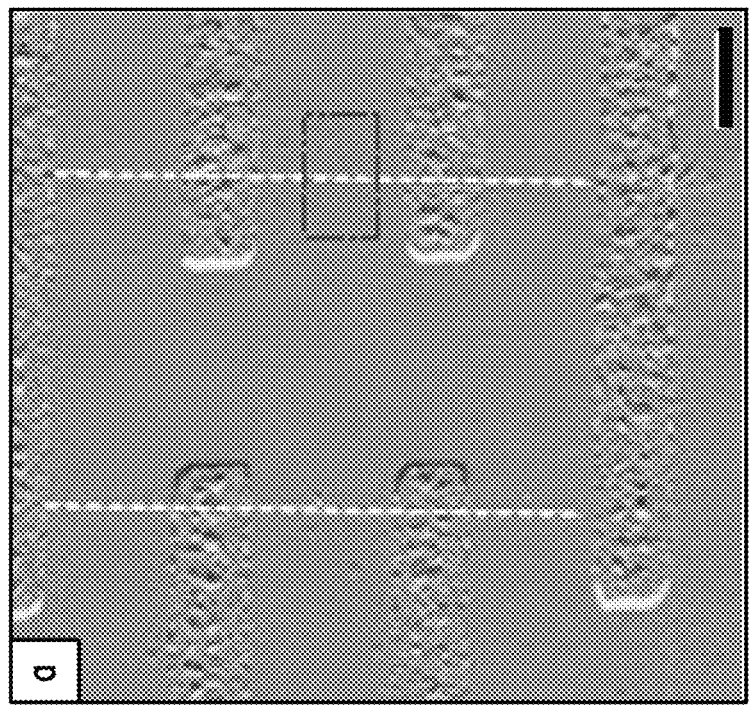
FIG. 3

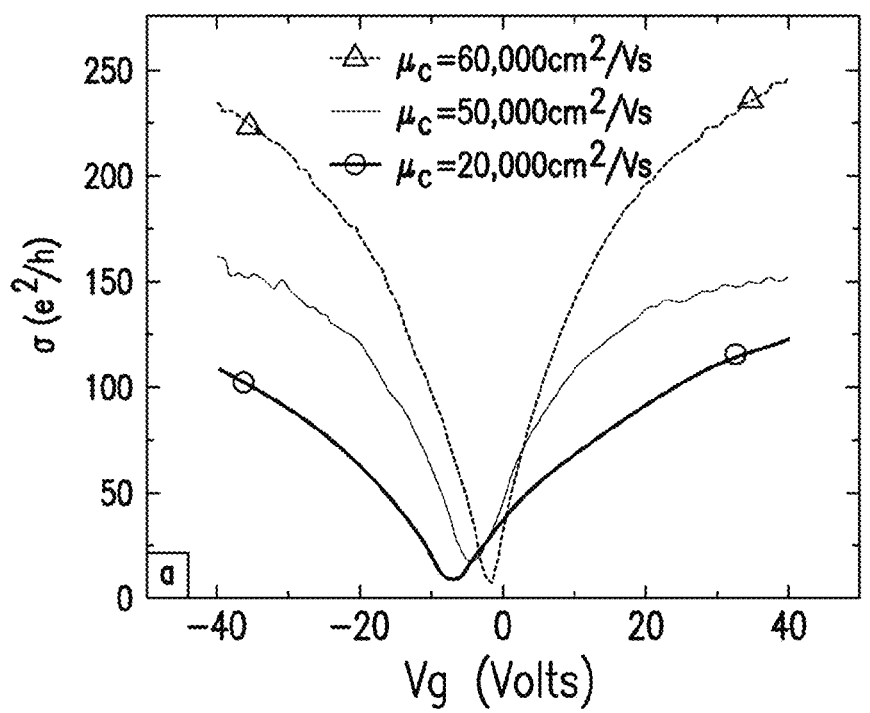
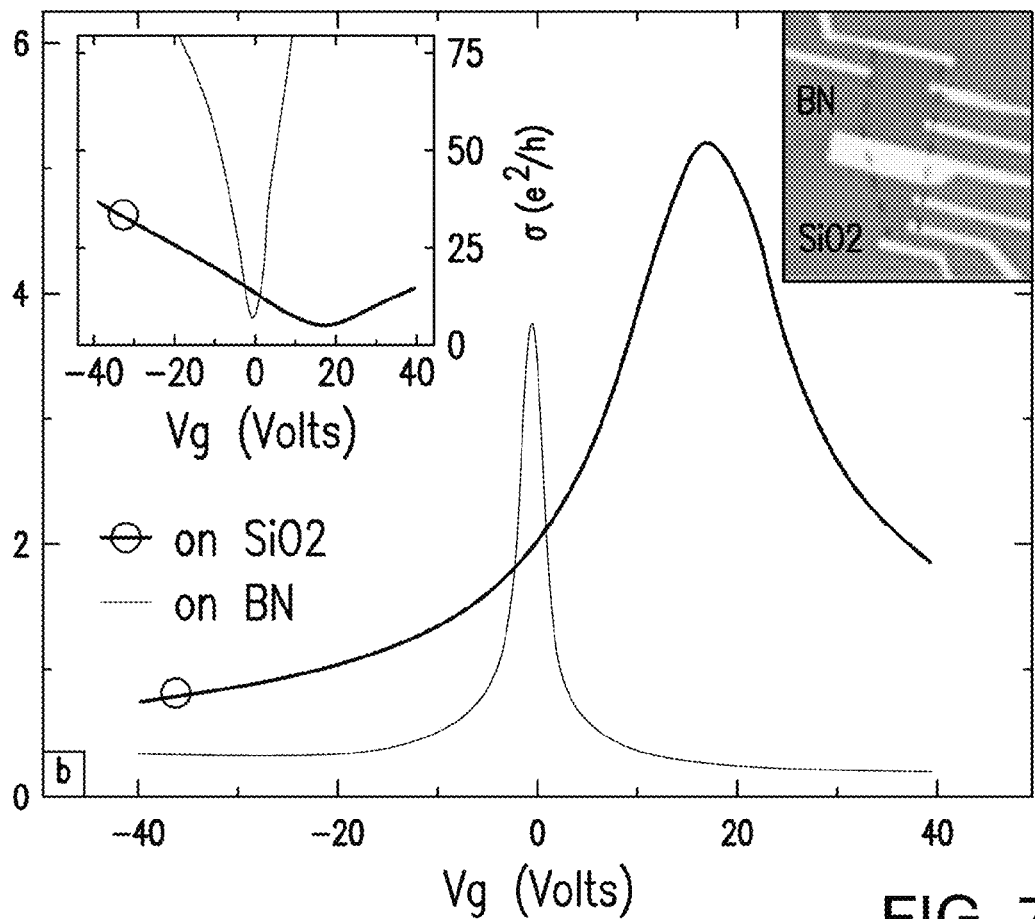
FIG. 7

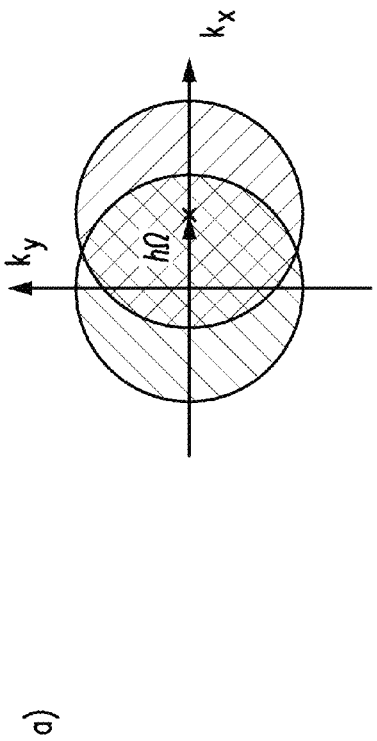

a)

b)

$$n(x) = \sqrt{n_0^2 + \left(C_g/e\ (V_{g2}-V_0-V(x))\right)^2} \quad \text{(Eq.1)}$$

$$\nu_d(x) = \frac{\mu E}{1 + \mu E/\nu_{sat}} \quad \text{(Eq.2)}$$

$$\nu_{sat} = \frac{2\sqrt{(k_f-\Omega)^2}\left((k_f^2+\Omega^2)E\left[-\frac{4k_f\Omega}{(k_f-\Omega)^2}\right]-(k_f^2+\Omega^2)K\left[-\frac{4k_f\Omega}{(k_f-\Omega)^2}\right]\right)}{3k_f^2\pi\Omega} \quad \text{(Eq.3)}$$

$$\nu_{sat} \cong \nu_f\frac{\hbar\Omega}{E_F} \quad \text{for } \hbar\Omega \ll E_F \quad \text{(Eq.4)}$$

$$I_d = W/L\ d\int_0^L en(x)\nu_d(x)dx \quad \text{(Eq.5)}$$

FIG. 15

ELECTRICAL DEVICES WITH GRAPHENE ON BORON NITRIDE

CROSS-REFERENCE TO RELATED PATENT DOCUMENTS

This application is a division of U.S. patent application Ser. No. 13/996,214, filed Nov. 4, 2013, which is a U.S, National Stage Application under 35 U.S.C. 371 of PCT/US2011/066620, filed Dec. 21, 2011, and published on Jun. 28, 2012 as WO 2012/088334, which claims the benefit of priority, under 35 U.S.C. Section 119(e), to U.S. Provisional Patent Application Ser. No. 61/425,636, filed on Dec. 21, 2010; each of which is incorporated by reference herein in its entirety.

STATEMENT REGARDING FEDERALLY SPONSORED RESEARCH OR DEVELOPMENT

This invention was made with government support from the Defense Advanced Research Projects Agency (DARPA). The government has certain rights in this invention.

TECHNICAL FIELD

Various embodiments described herein relate to electrical devices, and methods associated with graphene.

BACKGROUND

Graphene can be described as a two-dimensional sheet of covalently-bonded carbon atoms. For example, three-dimensional graphite can include sheets of graphene, and a one-dimension carbon nanotube can include a graphene wall (e.g., forming a single-wall carbon nanotube). An obstacle to development of a graphene-based electronic device, such as a graphene field-effect transistor (GFET), can be the surface supporting the graphene.

OVERVIEW

The present electronic devices and methods utilizing graphene provide improvements in manufacturing and device performance. To better illustrate the electronic devices and methods utilizing graphene, a non-limiting list of examples is now provided:

In Example 1, an electronic device includes a boron nitride surface with a graphene layer over the boron nitride surface having a non-zero degree of lattice mismatch, and one or more electrical contacts on the graphene layer.

In Example 2, the electronic device of Example 1 is optionally configured such that the one or more electrical contacts include a pair of source/drain regions having a graphene channel region located therebetween, and a gate electrode located adjacent to the graphene channel region to form a transistor.

In Example 3, the electronic device of any one or any combination of Examples 1-2 is optionally configured such that the non-zero degree of lattice mismatch includes rotation about a line normal to an interface plane between a lattice in the graphene layer and a lattice in the boron nitride surface.

In Example 4, the electronic device of any one or any combination of Examples 1-3 is optionally configured such that the boron nitride surface includes a boron nitride layer over a substrate.

In Example 5, the electronic device of any one or any combination of Examples 1-4 is optionally configured such that the gate electrode is below the graphene channel region.

In Example 6, the electronic device of any one or any combination of Examples 1-5 is optionally configured such that the gate electrode is separated from the graphene channel region by the boron nitride layer.

In Example 7, the electronic device of any one or any combination of Examples 1-6 is optionally configured such that the gate electrode is above the graphene channel region.

In Example 8, the electronic device of any one or any combination of Examples 1-7 is optionally configured such that the transistor is formed on a silicon substrate.

In Example 9, the electronic device of any one or any combination of Examples 1-8 is optionally configured such that the transistor is formed on an $SiO_2$ layer on the silicon substrate.

In Example 10, a method of forming an electronic device includes forming a graphene layer and mechanically placing the graphene layer on a boron nitride layer wherein the graphene layer is placed with a non-zero degree of lattice mismatch with the boron nitride layer, and attaching one or more electrical contacts to the graphene layer.

In Example 11, the method of Example 10 is optionally configured such that forming the graphene layer includes forming the layer on a separate substrate using chemical vapor deposition techniques.

In Example 12, the method of any one or any combination of Examples 10-11 is optionally configured such that using chemical vapor deposition techniques includes forming on a copper catalyst layer.

In Example 13, the method of any one or any combination of Examples 10-12 is optionally configured such that using chemical vapor deposition techniques includes forming on a nickel catalyst layer.

In Example 14, the method of any one or any combination of Examples 10-13 is optionally configured to further include forming the boron nitride layer using chemical vapor deposition techniques.

In Example 15, the method of any one or any combination of Examples 10-14 is optionally configured such that forming the boron nitride layer using chemical vapor deposition techniques includes forming on a copper catalyst layer.

In Example 16, the method of any one or any combination of Examples 10-15 is optionally configured such that forming the boron nitride layer using chemical vapor deposition techniques includes forming on a nickel catalyst layer.

In Example 17, a method of forming a graphene field effect transistor includes forming a graphene layer using chemical vapor deposition techniques, mechanically placing the graphene layer on a boron nitride layer, wherein the graphene layer is placed with a non-zero degree of lattice mismatch with the boron nitride layer, forming a pair of source/drain regions coupled to the graphene layer, defining a graphene channel region located therebetween, and coupling a gate electrode adjacent to the graphene channel region, and electrically separated from the graphene channel region.

In Example 18, the method of Example 17 is optionally configured such that the forming the graphene layer using chemical vapor deposition techniques includes forming the graphene layer using a sacrificial catalyst layer.

In Example 19, the method of any one or any combination of Examples 17-18 is optionally configured such that forming the graphene layer using a sacrificial catalyst layer includes forming the graphene layer using a metallic catalyst layer.

In Example 20, a method of forming a graphene field effect transistor includes forming a pair of source/drain regions on a graphene layer, defining a graphene channel region located therebetween, forming a boron nitride layer using chemical vapor deposition techniques, mechanically placing the boron nitride layer on the graphene layer, forming an interface having a non-zero degree of lattice mismatch with the graphene channel region, and coupling a gate electrode adjacent to the graphene channel region, and electrically separated from the graphene channel region.

In Example 21, the method of Example 20 is optionally configured such that forming the boron nitride layer using chemical vapor deposition techniques includes forming the boron nitride layer using a sacrificial catalyst layer.

In Example 22, the method of any one or any combination of Examples 20-21 is optionally configured such that forming the boron nitride layer using a sacrificial catalyst layer includes forming the boron nitride layer using a metallic catalyst layer.

These and other examples and features of the present electronic devices and methods utilizing graphene, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

BRIEF DESCRIPTION OF THE DRAWINGS

FIG. 3 shows a surface roughness comparison of electrical devices according to an embodiment of the invention.

FIG. 7 shows graphs of electrical characteristics of graphene devices according to embodiments of the invention.

FIG. 15 shows selected modeling parameters of graphene devices according to embodiments of the invention.

DETAILED DESCRIPTION

Methods of forming and resulting devices are described that include graphene devices on boron nitride. Selected methods and resulting devices include graphene field effect transistors (GFETs) including boron nitride.

Figures 1A, 1B:
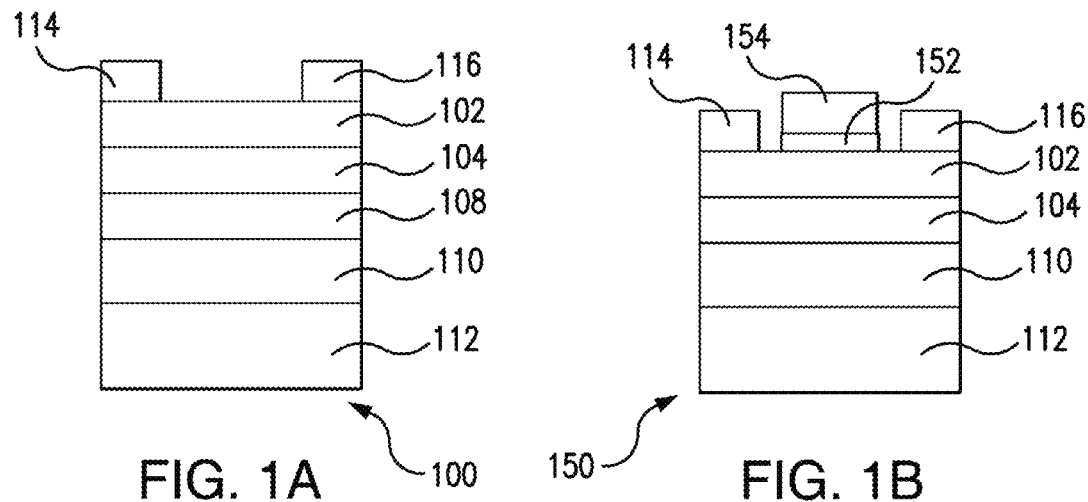
FIG. 1A shows a transistor according to an embodiment of the invention.
FIG. 1B shows another transistor according to an embodiment of the invention.

FIG. 1A illustrates generally a section view of a device 100 that can include an electronic device having a graphene layer 102. In the example shown, the device 100 includes a transistor, although the invention is not so limited. Other electronic devices utilizing a graphene layer with improved electrical properties as described below are also contemplated. FIG. 1A also illustrates a boron nitride (BN) layer 104 directly adjacent to the graphene layer 102.

In an example, the boron nitride layer 104 serves as a dielectric layer, that electrically separates the graphene layer 102 from a gate 108. In an example the gate 108 includes a metal or metal alloy. In an example the gate 108 includes more than one layer of conductors to improve interfacial compatibility. Examples of metals or metal layers include chromium, gold, and palladium.

FIG. 1A further illustrates a substrate 112. In an example, the substrate 112 includes silicon. In an example, a silicon substrate 112 includes a silicon oxide layer 110.

FIG. 1A further shows, one or more electrodes lithographically fabricated or otherwise formed as a portion of the device 100. For example, in FIG. 1A, a first electrode 114 and a second electrode 116 can be located on the graphene layer 102, such as spaced apart laterally along the graphene layer 102. In the example of FIG. 1, the graphene layer 102 can be transferred to or otherwise affixed or grown on the boron nitride layer 104. In an example, the graphene layer 102 is grown on a separate surface, for example by chemical vapor deposition (CVD) techniques, then transferred to the boron nitride layer 104. In an example, the boron nitride layer 104, can be grown on a separate surface, for example by chemical vapor deposition (CVD) techniques, then transferred to a position in the device 100.

In an example of separate surface fabrication, a graphene layer, or a boron nitride layer, or both graphene and boron nitride layers are formed on a catalyst layer such as a metal layer. Examples of metal catalyst layers include, but are not limited to, copper catalyst layers and nickel catalyst layers. In an example the metal layer is a bulk surface. In examples, the metal layer is deposited on a smooth substrate, such as sapphire or another suitably smooth surface, and the graphene layer or boron nitride layer is grown by CVD on the metal layer. After growth of the graphene layer and/or boron nitride layer, the layers are assembled as described to form devices such as device 100 described above or device 150 described below.

As discussed above, the device 100 operates as a field-effect transistor (FET) device, such as using the first electrode 114 as a source (or drain) electrode, using the second electrode 116 as a corresponding drain (or source) electrode, and using layer 108 as a gate. Such an example can be referred to as a back gate, because the gate layer 108 is located underneath the graphene layer 102.

FIG. 1B illustrates an example of a device 150 including a substrate 112 with or without a surface oxide 110. Similar to FIG. 1A, the device 150 includes a graphene layer 102 forming a direct interface with a boron nitride layer 104, and electrodes 114 and 116 coupled to the graphene layer 102. The example of FIG. 1B illustrates an example of a top gate device, with the inclusion of a dielectric layer 152, and a gate 154. Although a boron nitride layer 104 of a given thickness on a substrate of a different material is shown, the invention is not so limited. In an embodiment, the boron nitride 104 includes a boron nitride substrate. An example of a boron nitride substrate can include a single crystal boron nitride wafer.

Placing a graphene layer on boron nitride can provide a number of advantages, as discussed in the description below. For example, a surface roughness of the boron nitride is significantly smoother than other substrates, which greatly improves electrical properties of the adjacent graphene layer. Electrical transport is also enhanced in graphene on boron nitride as a result of reduced charged impurities from the relatively inert 13N surface. Boron nitride surfaces are relatively inert, due to in-plane bonding and tendency for fewer defects in a single-crystal boron nitride, compared with silicon or silicon oxide.

Using configurations such as shown in FIG. 1A, use of a boron nitride layer not only improves electrical characteristics of the graphene layer, but it can also serve as a dielectric layer in a transistor structure.

Graphene devices on standard $SiO_2$ substrates are highly disordered, exhibiting characteristics far inferior to the expected intrinsic properties of graphene. While suspending graphene above the substrate yields substantial improvement in device quality, this geometry imposes limitations on device architecture and functionality. Obtaining suspended-like sample quality in a substrate supported geometry is desired.

This disclosure describes examples of fabrication and characterization of high quality exfoliated mono- and bilayer graphene (MLG and BLG) devices on single crystal hexagonal boron nitride (h-BN) substrates, by a mechanical transfer process. Variable-temperature magnetotransport measurements demonstrate that graphene devices on h-BN exhibit enhanced mobility, reduced carrier inhomogeneity, and reduced intrinsic doping in comparison with $SiO_2$-supported devices. The ability to assemble crystalline layered materials in a controlled way permits advancements in graphene electronics and enables fabrication of more complex graphene heterostructures.

The quality of substrate-supported graphene devices has not improved since the first observation of the anomalous quantum Hall effect in graphene and its bilayer. On $SiO_2$, the carrier mobility is limited by scattering from charged surface states and impurities, substrate surface roughness and $SiO_2$ surface optical phonons. Moreover, near the Dirac point substrate induced disorder breaks up the 2D electron gas (2DES) into an inhomogeneous network of electron and hole puddles, while charged impurities trapped in the substrate or at the graphene-substrate interface cause doping of the 2DES away from charge neutrality. Efforts to engineer alternatives to $SiO_2$ can involve other oxides, where similar surface effects continue to be problematic.

Hexagonal boron nitride (h-BN) is an appealing substrate dielectric for improved graphene-based devices. h-BN is an insulating isomorph of graphite with boron and nitrogen atoms occupying the inequivalent A and B sublattices in the Bernal structure. The different onsite energies of the B and N atoms lead to a large (5.97 eV) band gap and a small (1.7%) lattice constant mismatch with graphite. Owing to the strong, in-plane, ionic bonding of the planar hexagonal lattice structure, h-BN is relatively inert and expected to be free of dangling bonds or surface charge traps. Furthermore, the atomically planar surface should suppress rippling in graphene, which has been shown to mechanically conform to both corrugated and flat substrates. The dielectric properties of h-BN ($\in$~3-4 and $V_{Breakdown}$~0.7 V/nm) compare favorably with $SiO_2$, allowing the use of h-BN as a gate dielectric with no loss of functionality. Moreover, the surface optical phonon modes of h-BN have energies two times larger than similar modes in $SiO_2$, suggesting the possibility of improved high-temperature and high electric field performance of h-BN based graphene devices over those using typical oxide/graphene stacks.

Figure 2:
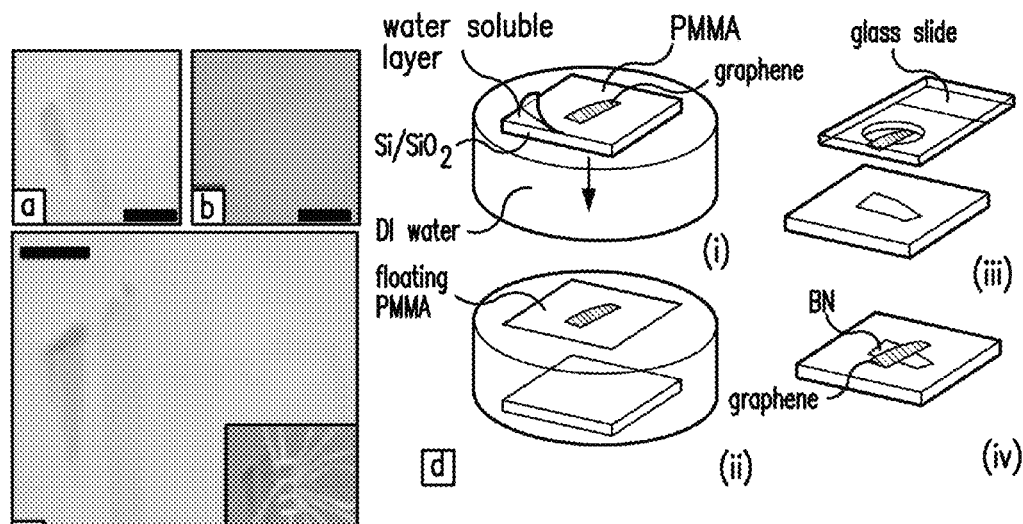
FIG. 2 shows a method of forming an electrical device according to an embodiment of the invention.

In an example method of fabricating graphene-on-BN, a mechanical transfer process is used, illustrated in FIG. 2. FIG. 2 shows optical images of graphene and h-BN before (a and b, respectively) and after (c) transfer. Scale bar in each is 10 μm. Inset shows electrical contacts. (d) Schematic illustration of the transfer process to fabricate graphene-on-BN devices.

In an example, the h-BN flakes are exfoliated from ultra-pure, hexagonal-BN single crystals. The optical contrast on 285 nm $SiO_2$/Si substrates is sufficient to easily identify h-BN flakes with thicknesses down to a single monolayer (see FIG. 2b). FIG. 3 shows atomic force microscopy (AFM) images of mono layer graphene (MLG) transferred onto ~14 nm thick h-BN. The transferred graphene is free of wrinkles or distortions. FIG. 3 shows (a) AFM image of monolayer graphene on BN with electrical leads. White dashed lines indicate the edge of the graphene flake. Scale bar is 2 μm. (b) Histogram of the height distribution (surface roughness) measured by AFM for $SiO_2$ (black triangles), h-BN (red circles) and graphene-on-BN (blue squares). Solid lines are Gaussian fits to the distribution. Inset: high resolution AFM image showing comparison of graphene and BN surfaces, corresponding to the dashed square in (a). Scale bar is 0.5 μm A histogram of the roughness of graphene on h-BN (FIG. 3b) shows it to be indistinguishable from bare h-BN and approximately three times less rough than $SiO_2$. This shows that the graphene membrane conforms to the atomically flat h-BN. Electronic transport measurements of MLG transferred onto h-BN indicate that the resulting two dimensional electronic systems are of high quality. FIG. 4a shows the resistance of a typical MLG sample on h-BN as a function of applied back gate voltage, $V_g$. The resistivity peak, corresponding to the overall charge neutrality point (CNP), is extremely narrow and occurs at nearly zero gate voltage. The conductivity (dotted line inset in FIG. 4a) is strongly sublinear in carrier density, indicating a crossover from scattering dominated by charge impurities at low density to short-range impurity scattering at large carrier density. The data is well fit (solid line in figure) by a self-consistent Boltzmann equation for diffusive transport that includes both long and short range scattering, σ–1=(neμC+σ$_o$)–1+ρs, where μC is the density-independent mobility due to charged impurity Coulomb (long-range) scattering, ρS is the contribution to resistivity from short-range scattering, and σ$_o$ is the residual conductivity at the CNP. We obtain μC~60,000 cm2/Vs, three times larger than on SiO$_2$ using a similar analysis, and ρS~71Ω, which is similar to values obtained on SiO$_2$. This indicates a threefold decrease in the scattering rate due to charge-impurities in this sample, but a similar degree of short range scattering, in comparison to the best SiO$_2$ samples. This suggests that the sublinear shape does not result from increased short range scattering on BN substrates, but rather a substantially reduced charge impurity contribution, which reveals the effects of short range scattering at comparatively lower densities. Similar behavior was observed in more than 10 MLG samples and, importantly, a higher mobility for BN-supported graphene is shown as compared to portions of the same flake on the nearby SiO$_2$ surface. For the MLG device shown here, the Hall mobility is ~25,000 at high density, where short range scattering appears to dominate. Similar values of ρS between SiO$_2$ and h-BN supported-graphene samples suggests that scattering off ripples and out-of-plane vibrations may not be a significant contribution in samples since these are likely to be suppressed on atomically flat h-BN.

Figure 4:
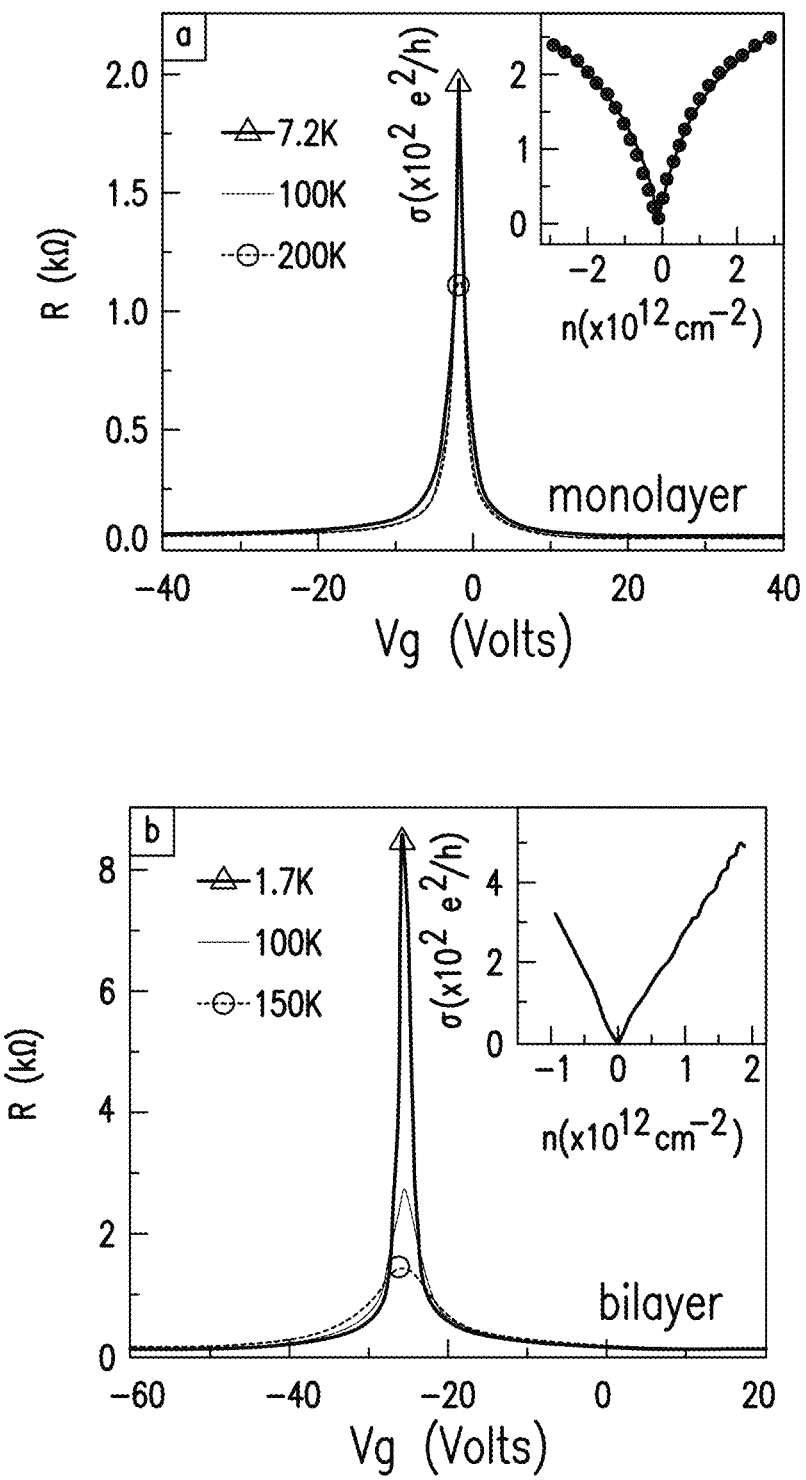
FIG. 4 shows graphs of electrical characteristics of graphene devices according to embodiments of the invention.
Figure 4:
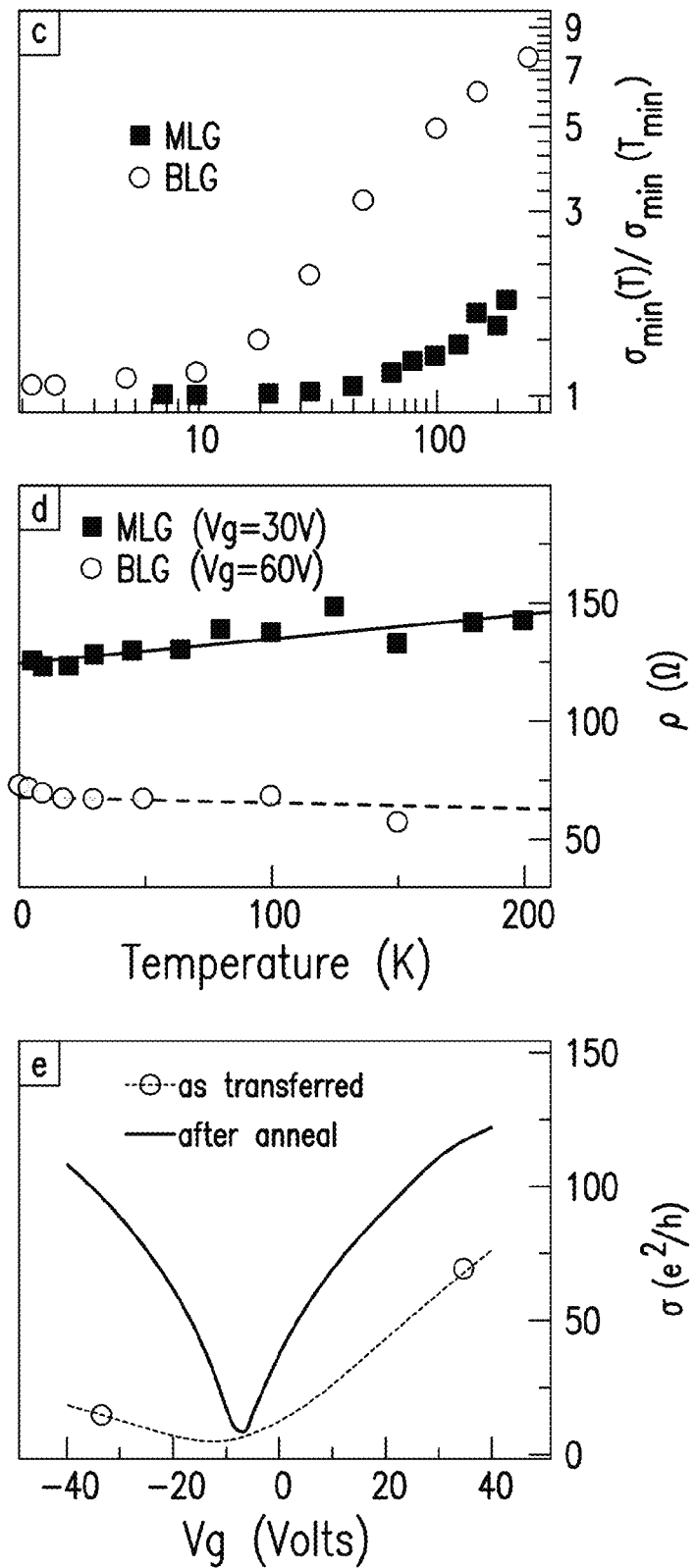

FIG. 4 shows: resistance versus applied gate voltage for (a) MLG and (b) bi-layer graphene (BLG) on h-BN. Inset in each panel shows the corresponding conductivity. For both devices, the temperature dependence of the conductivity minimum and high density resistivity are shown in (c) and (d), respectively. Solid and dashed lines in (d) are linear fits to the data. (e) Conductivity of a different MLG sample comparing the room-temperature transport characteristics measured as transferred to h-BN (blue curve) and after annealing in H$_2$Ar (black curve).

The width of the resistivity peak at the CNP gives an estimate of the charge-carrier inhomogeneity resulting from electron-hole puddle formation at low density. In FIG. 4a the full width at half maximum (FWHM) of ρ(Vg) is ~1 V, giving an upper bound for disorder-induced carrier density fluctuation of δn<7×10$^{10}$ cm$^{-2}$, a factor of ~3 improvement over SiO$_2$-supported samples. An alternate estimate of this inhomogeneity is obtained from the temperature dependence of the minimum conductivity. In FIG. 4c, σ$_{min}$ increases by a factor of two between 4 K and 200 K. Such a strong temperature dependence has previously only been observed in suspended samples, with substrate-supported samples typically exhibiting <30% variation in the same range. σ$_{min}$ is expected to vary with temperature only for k$_B$T>E$_{puddle}$ where for MLG E$_{puddle}$≈hvf√πδn. Here σ$_{min}$ saturates to ~6e$^2$/h for T<15 K giving an upper bound of δn~109 cm$^{-2}$. The δn estimated by these two measures is consistent with similar analysis performed on suspended devices.

A bandgap can be induced in graphene aligned to an h-BN substrate. In our disclosure, the crystallographic orientation of graphene to the substrate can be controlled to any number of orientations. As a result, symmetry breaking effects can be controlled and avoided. Indeed, the temperature dependence of σ$_{min}$ observed here does not follow a simply activated behavior, indicating no appreciable gap opening in this randomly stacked graphene on h-BN.

In an example, the crystallographic orientation of graphene to the substrate provides a non-zero lattice mismatch between the graphene lattice and the boron nitride lattice, as a result of mechanical placing of graphene in contact with boron nitride.

A graphene layer that is epitaxially grown on a substrate such as boron nitride may have a different lattice constant than boron nitride. However, even with different lattice constants, under epitaxial growth techniques, with a small degree of lattice strain, there will still be a substantial one-to-one alignment of carbon atoms in graphene with boron and nitrogen atoms in the boron nitride lattice.

In contrast to epitaxially grown graphene on boron nitride, with mechanical assembly as described in examples of the present invention, the graphene will not be significantly aligned to the h-BN substrate. In other words, there will not be a one-to-one correspondence of carbon atoms in the graphene lattice to a corresponding boron or nitrogen atom in the boron nitride lattice. Some degree of rotation about a line normal to the interface plane between the graphene lattice and the boron nitride lattice provides the non-zero degree of lattice mismatch between the graphene layer and the boron nitride.

Using mechanical transfer techniques, absent any significant doping levels or other impurities which might otherwise modify lattice alignment, a substantially pure graphene layer can be brought into contact with a substantially pure boron nitride substrate with a non-zero degree of lattice mismatch. The mechanical assembly technique takes advantage of the smoothness of boron nitride, without unwanted bandgap effects from epitaxial lattice alignment between graphene and boron nitride.

Transport measurements from BLG transferred to h-BN are shown in FIG. 4b. The corresponding conductivity is linear in gate voltage up to large densities, as expected for BLG in the presence of long and short range scalar potential disorder. The (density-independent) electron and hole Hall mobilities are ~60,000 cm$^{-2}$Ns and ~80,000 cm$^2$/Vs, respectively, at T=2 K, with a value of 40,000 cm$^{-2}$/Vs measured at room temperature in air for this same device. The FWHM of the CNP resistivity peak is ~1.2 V, giving an estimate of the carrier inhomogeneity density δn~9×10$^{10}$ cm$^{-2}$. Both the mobility and inhomogeneity are comparable to the best suspended BLG devices and almost an order of magnitude better than BLG on SiO$_2$. The temperature dependence of σ$_{min}$ (blue circles in FIG. 4c) is much stronger than in MLG. We note that the BLG shown, although undoped immediately after sample fabrication and annealing, was contaminated upon insertion into a Helium flow cryostat; thereafter the CNP was found at Vg~–27 V. The temperature dependence at the CNP can therefore be due in part to an electric field induced energy gap. The temperature dependence of the resistivity at high density for both MLG and BLG is shown in FIG. 4d. MLG resistance increases linearly with temperature (solid line in FIG. 4d) due to longitudinal acoustic (LA) phonon scattering:

$$\rho_{LA}(T) = \left(\frac{h}{e^2}\right)\frac{\pi^2 D_A^2 k_B T}{2h^2 \rho_z v_s^2 v_f^2}$$

where ρs=7.6×10$^{-7}$ kg/m$^{-2}$ is the graphene mass density, v$_f$=1×10$^6$ m/s is the Fermi velocity, v$_s$=2×10$^4$ m/s is the LA phonon velocity and D$_A$ is the acoustic deformation potential. Linear fits to the electron (hole) branches give D$_A$ ~18 eV (D$_A$~21 eV). In contrast, BLG exhibits a very weak temperature dependence, with a slightly negative overall trend (dashed line in FIG. 4d). We note that no indication of activated remote surface phonon scattering is seen in MLG (BLG) up to 200 K (240 K).

The replacement of the $SiO_2$ substrate with h-BN appears to result in a marked change in the chemical properties of graphene devices. FIG. 4e shows the room temperature conductivity of a typical MLG layer before and after annealing in a $H_2$/Ar flow at 340° C. for 3.5 hrs. Annealing substantially enhances the carrier mobility while leaving the position of the CNP virtually unchanged. The low mobility immediately post transfer can be due to neutral transfer residues and/or local strains that are relaxed upon heating. The lack of doping after heating in $H_2$/Ar is in stark contrast to $SiO_2$ supported devices. where heat treatment typically results in heavy doping of the graphene, often more than $5\times10^{12}$ $cm^{-2}$, after re-exposure to air. The reduced chemical reactivity of graphene on h-BN is due to a combined effect of the chemically inert and gas impermeable h-BN surface together with reduced roughness in the graphene film. Magnetotransport measurements provide further confirmation of the high material quality achieved in these samples.

Figure 5:
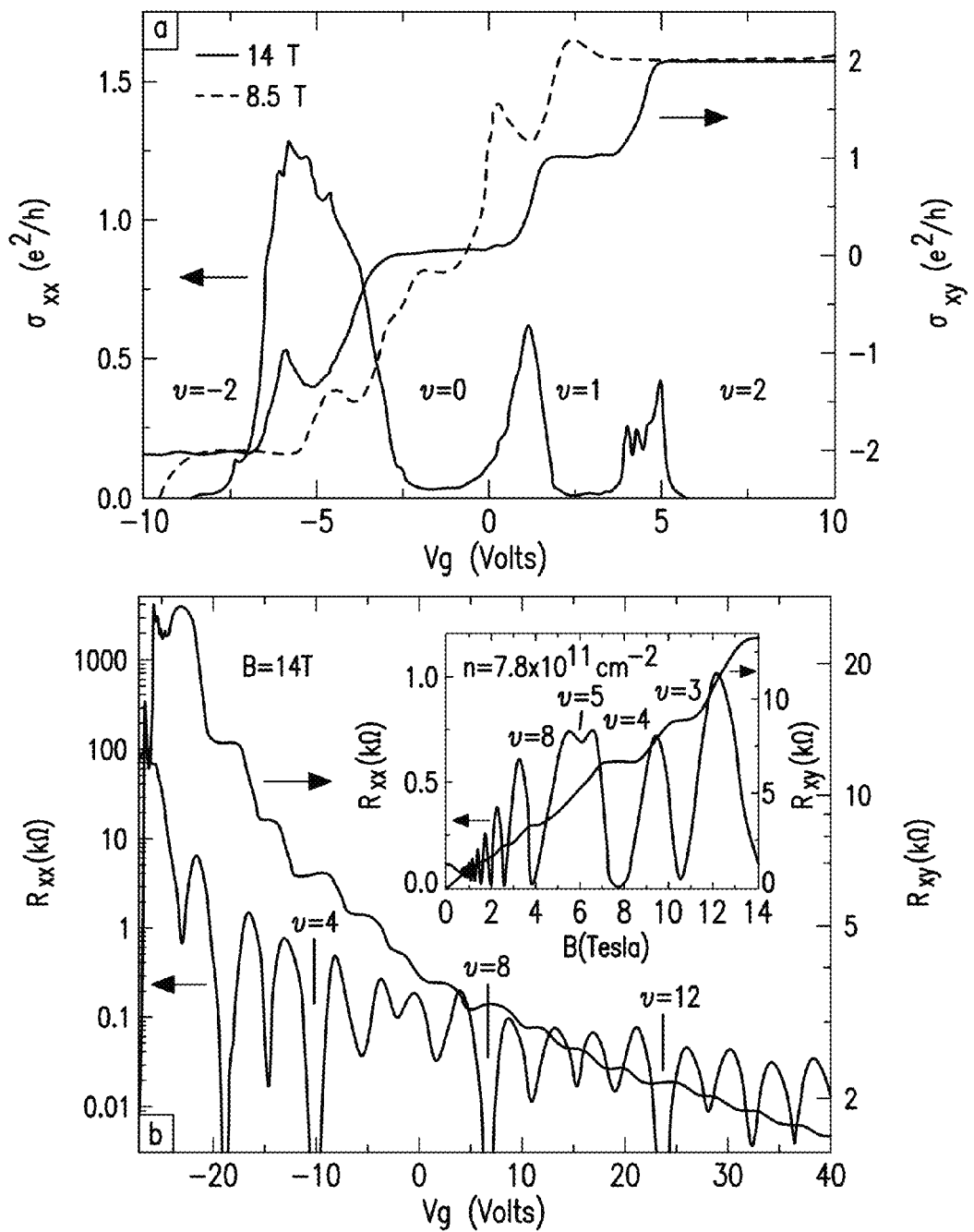
FIG. 5 shows graphs of electrical and magnetic characteristics of graphene devices according to embodiments of the invention.

FIG. 5 shows: (a) Longitudinal and Hall conductivity versus gate voltage at B=14 T (solid line) and 8.5 T (dashed line) for MLG. (b) Longitudinal and Hall resistance versus gate voltage at B=14 T for BLG. Inset shows a magnetic field sweep at fixed density. SdH oscillations begin at ~0.4 T with Landau Level (LL) symmetry breaking appearing at fields less than 6 T. T~2 K in both panels.

FIG. 5a shows the magnetoconductivity $\sigma$ and Hall conductivity $\sigma_{xy}$ as a function of density at B=14 T for MLG, derived from simultaneous measurement of magnetoresistance R and Hall resistance $R_{xy}$ in the Hall bar geometry shown in FIG. 3. Complete lifting of the four-fold degeneracy of the zero energy Landau level (LL) is observed, with the additional quantum hall states at $\nu=0$, $+1,\pm2$ exhibiting quantized Hall conductance $\sigma_{xy}=\nu e^2/h$ together with vanishing $\sigma_{xy}$. The dashed line in FIG. 5a indicates that signatures of the $\nu=\pm 1$ quantum hall effect (QHE) are visible at fields as low as B=8.5 T, more than a factor of two smaller than reported for MLG on $SiO_2$.

A complete sequence of broken symmetry LLs are visible in BLG at B=14 T (FIG. 5b). In our device, the substrate supported geometry allows us to probe much higher density than possible in suspended devices of similar quality. Quantized Hall resistance is observed at $R_{xy}=(1/\nu)$ $h/e^2$ concomitant with minima in $R_{xx}$ for all integer filling factors from $\nu=1$ to at least $\nu=16$. Density sweeps at lower fields show that the lifting of the expected four-fold degeneracy in BLG is observable up to at least the fifth LL at fields as low as 5 T.

Complete quantization of the four-fold degenerate LLs and Shubnikov-de Haas oscillations is seen down to 2 and 0.4 T respectively. (see inset in FIG. 5b). In the lowest LL the $\nu=2$ quantum Hall state has a larger gap compared to the states at $\nu=1$ and 3, as judged by the depth of the $R_{xx}$ minimum. Interestingly, in the second LL, the situation is reversed, with $\nu=6$ weaker than $\nu=5$, 7. As the LL index is increased, the trend in the gaps evolves back towards that observed in the lowest LL. A full understanding of symmetry breaking with increasing LL index is complicated by the fact that the applied gate voltage and residual extrinsic doping can both simultaneously break the layer degeneracy in BLG and modify the exchange energy. Analysis of this trend can be studied in dual gated devices where the transverse electric field can be tuned independently. Preservation of high mobility in dual-gated device can be achieved by fabricating h-BN-graphene-h-BN stacks using a two-transfer technique.

In an example, graphene-on-BN devices are fabricated according to the procedure illustrated in (FIG. 2d): (i) Fabrication can begin with the mechanical exfoliation of h-BN single crystals onto silicon wafers coated in 285 nm thermal oxide. Graphene is exfoliated separately onto a polymer stack including a water soluble layer (e.g. Mitsubishi Rayon aquaSAVE) and PMMA, and the substrate is floated on the surface of a DI water bath; (ii) Once the water soluble polymer dissolves, the Si substrate sinks to the bottom of the bath leaving the extremely hydrophobic PMMA floating on top, (iii) The PMMA membrane is adhered to a glass transfer slide, which is clamped onto the arm of a micromanipulator mounted on an optical microscope. Using the microscope the graphene flake is precisely aligned to the target BN and the two are brought into contact. During transfer, the target substrate is heated to 110° C. such as to drive off any water adsorbed on the surface of the graphene or h-BN flakes as well as to promote good adhesion of the PMMA to the target substrate; (iv) Once transferred, the PMMA is dissolved in acetone. Electrical leads are deposited using standard electron beam lithography, after which all our samples are annealed in flowing $H_2$/Ar gas at 340° C. for 3.5 hours to remove resist residues. The devices did not undergo any further treatment (e.g., in-situ vacuum annealing etc.) after removal from the $H_2$/Ar flow.

In an example, graphene-on-BN devices are fabricated using a mechanical transfer technique with a water soluble sacrificial layer replaced by a polyvinyl alcohol (PVA) layer. This allows mechanical peeling of the PMMA membrane without the need for exposing the graphene/PMMA substrate to a water bath, thereby achieving a fully dry transfer method. Some degree of rotation in the mechanical transfer about a line normal to the interface plane between the graphene lattice and the boron nitride lattice provides a non-zero degree of lattice mismatch between the graphene layer and the boron nitride.

In an example, the h-BN or the graphene, or both the h-BN and graphene are derived from a synthetic growth technique, in contrast to exfoliation from a bulk crystal. An example of a synthetic growth technique, as described above, includes CVD formation of h-BN and/or graphene on a separate surface.

A graphene layer and/or a boron nitride layer can be formed on a catalyst layer such as a metal layer. Examples of metal catalyst layers include, but are not limited to, copper catalyst layers, nickel catalyst layers, etc. In an example the metal layer is a bulk surface. In other examples, the metal layer is deposited on a smooth substrate, such as sapphire or another suitably smooth surface, and the graphene layer or boron nitride layer is grown by CVD on the metal layer.

After growth of the graphene layer and/or boron nitride layer, the graphene and boron nitride layers can be mechanically placed in contact with each other, to form an interface that enhances the electrical properties of the graphene. For example, a surface roughness of the boron nitride is significantly smoother than other substrates, which greatly improves electrical properties of the adjacent graphene layer. Electrical transport is also enhanced in graphene on boron nitride as a result of reduced charged impurities from the relatively inert BN surface. Boron nitride surfaces are relatively inert, due to in-plane bonding and tendency for fewer defects in a single-crystal boron nitride, compared with silicon or silicon oxide.

In an example, although the individual components of the graphene layer and/or boron nitride layer are grown synthetically, the interface between the graphene and the boron nitride is formed by mechanically combining the layers, which provides an interface with a non-zero degree of lattice mismatch between the graphene and the boron nitride. Some degree of rotation about a line normal to the interface plane between the graphene lattice and the boron nitride lattice provides the non-zero degree of lattice mismatch between the graphene layer and the boron nitride. In contrast, epitaxial growth techniques of forming graphene on boron nitride, by definition, result in alignment between the lattices.

A bandgap can be induced in epitaxial graphene aligned to an h-BN substrate. In contrast, configurations formed using mechanical transfer techniques described herein, provide a crystallographic orientation of graphene to the substrate that can be controlled to any number of orientations. As a result, symmetry breaking effects can be controlled and/or avoided.

In an example, the graphene and/or boron nitride layer are removed from the catalyst layer and assembled to form electrical devices such as transistors described herein. In an example, the catalyst layer is a sacrificial layer, and the graphene layer and/or boron nitride layer become separated from the catalyst layer as a result of the destruction of the catalyst layer during synthesis of the graphene layer and/or boron nitride layer.

AFM images from FIG. 3 were acquired in air using silicon cantilevers operated in tapping mode. Surface roughness is reported as the standard deviation of the surface height distribution (determined by a fitted Gaussian), measured on a 0.3 μm² area. Transport measurements were acquired in a four-terminal geometry using standard lock-in techniques at ~17 Hz. Samples were cooled in a variable temperature (~2-300 K) liquid He flow cryostat with the sample in vapor.

Figure 6:
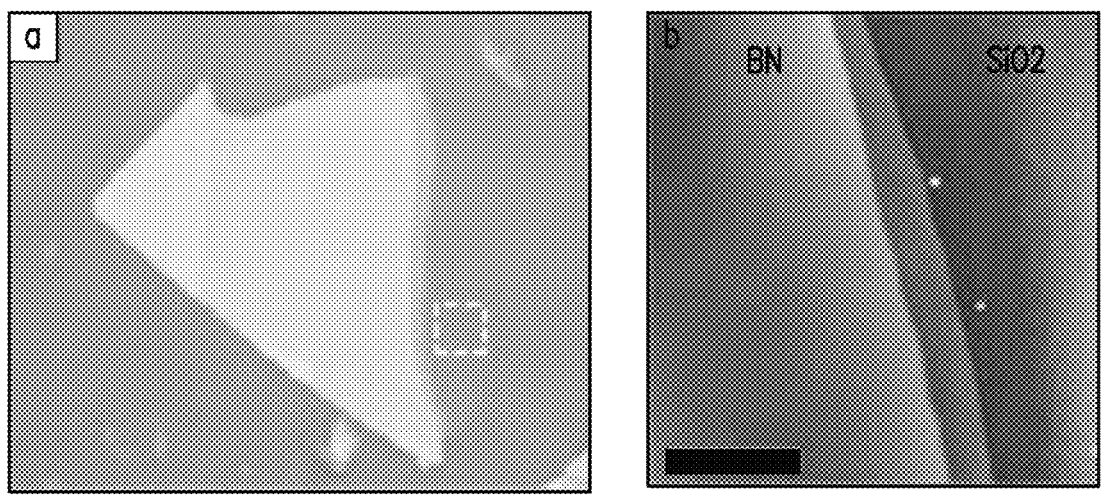
FIG. 6 shows a surface roughness comparison of electrical devices according to an embodiment of the invention.
Figure 6:
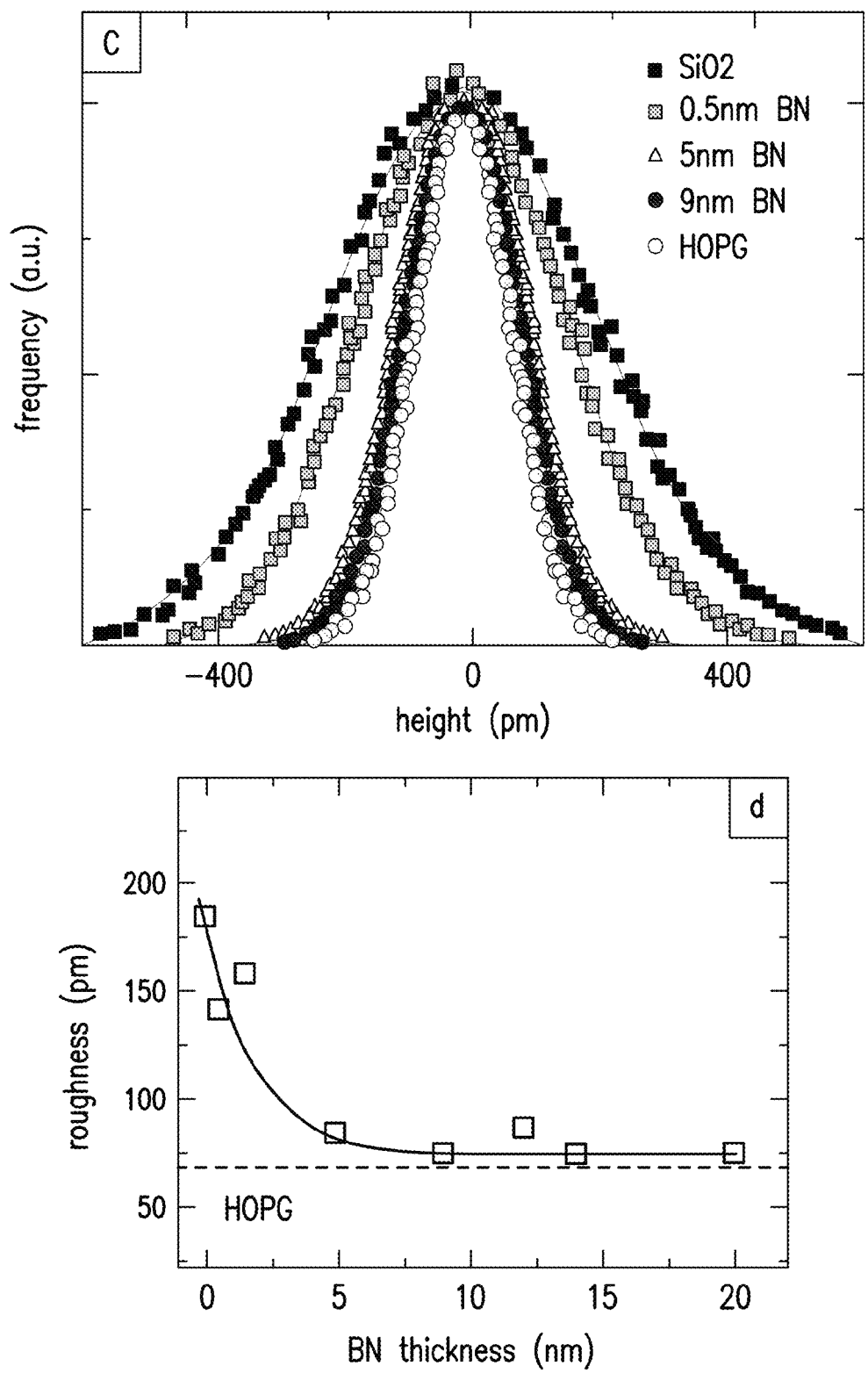

Before transferring graphene, the surface of every target h-BN flake is first characterized by atomic force microscopy to ensure it is free of contaminants or step edges, and also to measure its thickness. FIG. 6 a-b shows an example optical and AFM image of a clean h-BN surface after transfer onto a SiO₂ substrate. While the texture of the SiO₂ surface is visibly apparent, the h-BN surface looks completely devoid of any features on this scale.

FIG. 6 shows: (a) Optical image of a representative h-BN flake exfoliated onto a Si/SiO₂ substrate. (b) AFM image of the region indicated in (a) by a dashed box. scale-bar is 0.5 μm. The h-BN surface seen here measures ~8 nm in height relative to the SiO₂ background. At this scale it is apparent the h-BN surface is much smoother than the underlying SiO₂ substrate, (c) Height histogram of the h-BN surface measured for several different sample-thicknesses. A typical measurement from a SiO₂ surface (solid black squares) and a highly ordered pyrolitic graphite (HOPG) wafer (open black circles) are shown for comparison. (d) h-BN surface roughness versus sample thickness measured from several different samples. Solid line is a guide-to-the-eye. Dashed line indicates resolution of our system, obtained by measuring the surface of HOPG under the same conditions.

FIG. 6c shows a histogram of the measured surface roughness for h-BN flakes of varying thicknesses. Measurements from a typical SiO₂ substrate, and from a calibration HOPG wafer are also shown, for comparison. All data was acquired on a 300 nm² scan window. The SiO₂ surface roughness, given by the standard deviation of a fitted Gaussian, is measured to be ~185 pm. The HOPG surface roughness is ~70 pm, which, since the HOPG wafer is atomically flat over large areas, is taken to be the resolution limit of our measurement. As seen in FIG. 6d, the h-BN surface roughness approaches the measured HOPG roughness for flakes thicker than approximately 5 nm.

FIG. 7 shows: (a) Representative conductivity curves measured for three different MLG samples transferred to h-BN. Legend indicates the corresponding mobility extracted by fitting to the Boltzmann model from the main paper. (b) Resistivity measured on a single flake spanning both BN and SiO₂ substrate regions. Inset left shows corresponding conductivities. Inset right shows optical image of the sample where the dashed line outlines the graphene. T~4 K in both (a) and (b).

FIG. 7a shows conductivity curves measured from three representative MLG layers transferred to h-BN. The mobilities indicated in the figure are extracted from fits using the same equation as in the main text. Similar to on SiO₂, there appears to be a correlation between sample quality and the charge neutrality position as well as the width of the conductivity minimum. Specifically, high quality samples coincide with a sharply defined conductivity minimum occurring near zero backgate, whereas, poorer quality samples exhibit broader minima further away from zero backgate voltage. This is consistent with the mobility enhancement observed in graphene-on-h-BN resulting from a reduction of charged impurities, relative to graphene on SiO₂. Further evidence of this is shown in FIG. 7b, where portions of the same graphene flake are measured both on h-BN and on SiO₂.

While on h-BN the graphene exhibits a very narrow resistivity peak, occurring nearly at zero gate voltage, on SiO₂ the same flake is significantly doped (VCNP ~25 Volts), and shows a broad peak. From the corresponding conductivity curves (shown inset in FIG. 7) we measure a mobility for the h-BN and SiO₂ supported regions of the same graphene flake to be ~20,000 cm²Ns and ~2,000 cm²Ns, respectively. While variation in sample quality, within the same graphene flake, is observed on samples supported only by SiO₂, we always observe a higher mobility on h-BN relative to SiO₂, when measuring a portion of the same flake on both surfaces.

Figure 8:
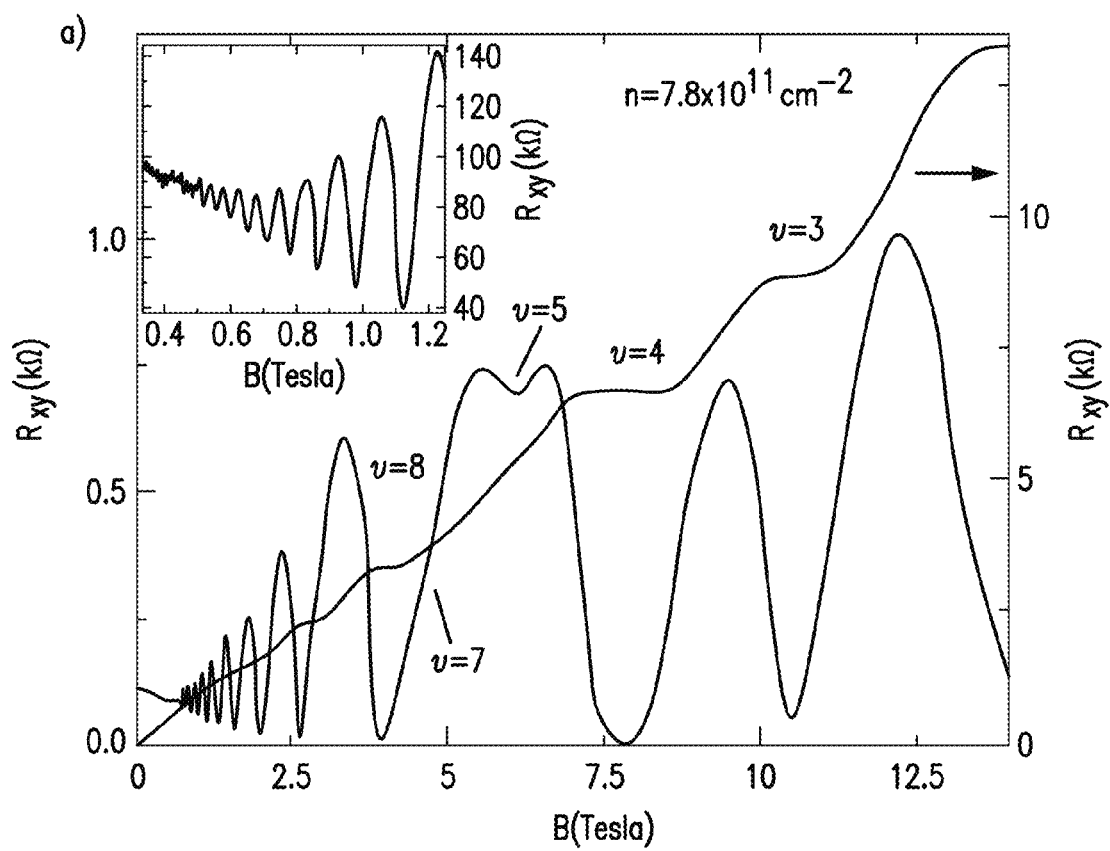
FIG. 8 shows graphs of electrical and magnetic characteristics of graphene devices according to embodiments of the invention.
Figure 9:
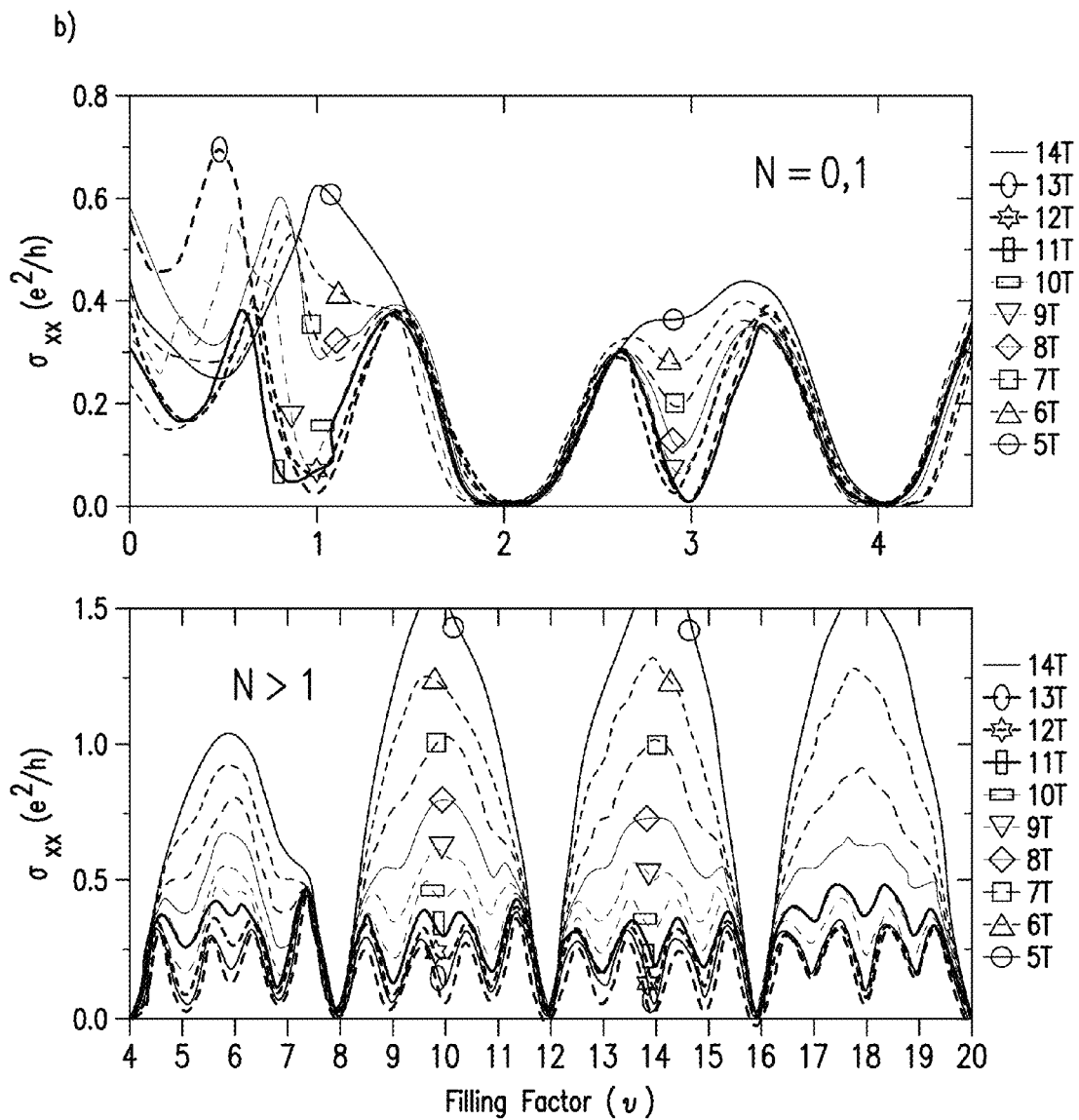
FIG. 9 shows graphs of electrical and magnetic characteristics of graphene devices according to embodiments of the invention.

FIG. 8 shows Magnetoresistance (blue curve) and Hall resistance (red curve) versus B field of the BLG sample on h-BN. T~4 K and n=7.8×1011 cm−2. Landau Levels between 5 and 14 Tesla are labeled. Inset shows low field SdH oscillations, measured under the same conditions. FIG. 9 shows Magnetoresistance versus gate voltage of the same sample. Upper panel shows symmetry breaking in the lowest energy Landau level (e.g. v|<4). Lower panel shows symmetry breaking of the higher order Landau levels. The data is plotted versus filling factor for easier comparisons between different magnetic fields.

FIG. 8 shows an enlargement of the magneto-transport measured from BLG on h-BN presented in FIG. 5. Landau levels (LL's) are labeled between 5 and 14 Tesla, indicating that appearance of the four-fold symmetry breaking is visible down to approximately 5 Tesla. Complete quantization of the four-fold degenerate Landau levels, evidence by both quantization in $R_{xy}$ and a zero value minimum in $R_{xx}$, is observed down to approximately 2 Tesla. The inset of FIG. 8 shows the low field Shubnikov de Haas oscillations, which are visible down to as low as 0.4 Tesla.

Magnetoresistance measured at fixed field, but varying backgate voltage, are shown for several different fields in FIG. 9. Minima in between the otherwise four-fold degenerate LL's, for LL index greater than v=4, begin to emerge at ~5 Tesla, becoming fully quantized for all integer fillings up to at least v=20 at 14 Tesla. In the lowest energy LL, where the n=0 and n−1 levels are doubly degenerate, the v=2 quantum Hall state shows a deep broad minimum at fields well below 5 Tesla.

Graphene field-effect transistors (GFETs) can benefit from engineering the dielectric interfaces to the graphene, both the supporting dielectric and the top gate dielectric. GFETs can be fabricated on doped silicon substrates with a 300 nm thick $SiO_2$ layer. Carrier density modulation is then achieved by biasing the silicon, or by employing a lithography step to deposit a local top-gate coupled to the graphene through a high-κ gate dielectric grown on the graphene. The deposition of these top-gate dielectrics often involves the initial deposition of a noncovalent functionalization layer absorbed on the graphene surface.

Both the top-gate oxide and supporting oxide substrate significantly degrade the electronic properties of the graphene. Charged impurities trapped in the dielectrics or at the graphene dielectric interfaces dope the graphene, significantly degrade mobility, and result in hysteretic current-voltage characteristics. Surface polar optical phonons from the substrate further limit room temperature and high-field transport and achievable saturation velocities. Transistor measurements of GFETs using hexagonal boron nitride (h-BN) are shown as both supporting substrate and local-gate dielectric, resulting in dramatically improved transistor current voltage characteristics.

Figure 10:
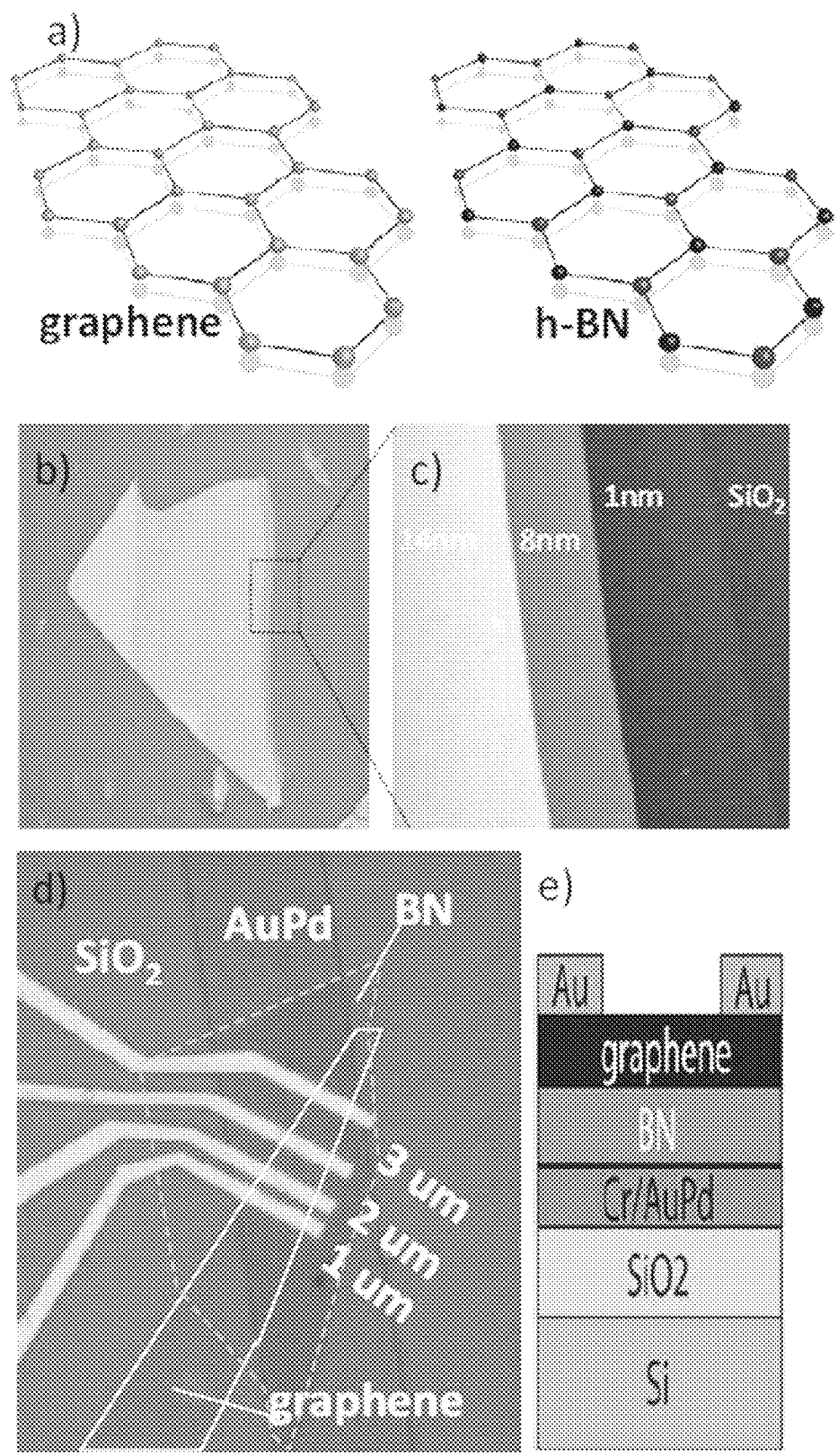
FIG. 10 shows atomic structure and macroscopic configurations of graphene devices according to embodiments of the invention.

FIG. 10 shows the basic structure of the back-gated (GFET) using h-BN dielectrics. The use of a backgated topology allows us to have to only contend with a single graphene-dielectric interface. h-BN is an appealing dielectric material for GFETs because it is an insulating isomorph of graphite (FIG. 10a) with boron and nitrogen atoms occupying the inquivalent A and B sublattices in the Bernal structure. h-BN is inert and free of dangling bonds and surface charge traps. The bandgap (5.97 eV) and dielectric properties of h-BN ($\in$~3-4 and $V_{Breakdown}$~0.7 V/nm) compare favorably with $SiO_2$. The excellent thermal conductivity of h-BN, 600 higher than silicon dioxide, is also advantageous for FET applications such as to reduce or minimize device heating.

To fabricate graphene-on-BN, we can employ a mechanical transfer process in which h-BN layers are exfoliated from ultrapure h-BN single crystals. The devices shown in FIG. 10d and measured here have a dielectric thickness of approximately 8.5 nm. Graphene on h-BN (as measured by atomic force microscopy) is approximately three times less rough than on $SiO_2$. Cr/Au (1 nm/90 nm) electrodes are used as Ohmic contacts, producing p-type doping of the graphene under the contacts because of work-function differences.

Figure 11:
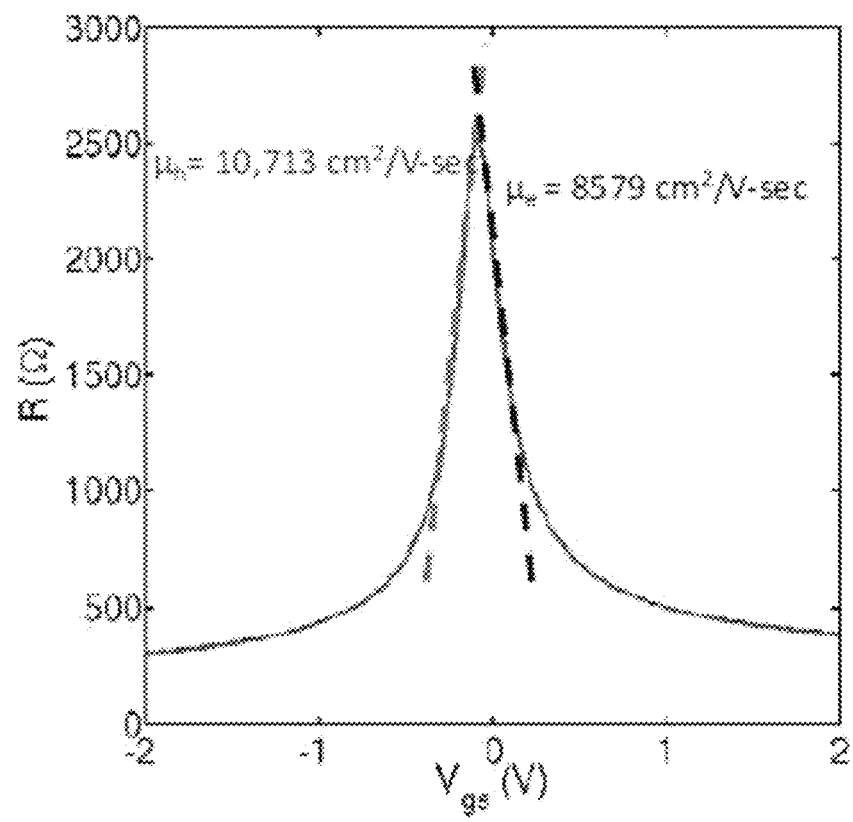
FIG. 11 shows graphs of electrical characteristics of graphene devices according to embodiments of the invention.

FIG. 11 shows the channel resistance (1/gds) at Vds=10 mV as a function of Vgs for a W/L=3.4 µm/2.8 µm device. Low-field mobility of these devices exceeds 10,000 $cm^2$/V-sec. The carrier concentration in the channel is given by FIG. 15 (Eqn. 1), where $n_0 \approx 2.2 \times 10^{11}$ $cm^{-2}$ is the minimum sheet carrier concentration as determined by disorder and thermal excitation. Cg ($\approx$363 $nF/cm^2$) is given by the parallel combination of the electrostatic capacitance of the gate and the quantum capacitance of graphene (which ultimately limits achievable gate capacitances). There is almost no net extrinsic doping of the graphene channel with $V_0 \approx 0.07$ V with a gate voltage hysteresis of less than 10 mV at room temperature. BN supported devices are found to be more stable compared to their SiO2 supported counterparts, as heating and high-bias stress have virtually no effect on the transport characteristics. For a p-type channel (matching the doping of the source and drain contacts), the contact resistance is approximately 673 $\Omega/\mu m^2$. n-type channels show a contact resistance that is approximately 31% higher for this device geometry because of the additional resistance of the p-n junction at the source/drain. Subsequent large-signal characterization uses these devices as pFETs.

Figure 12:
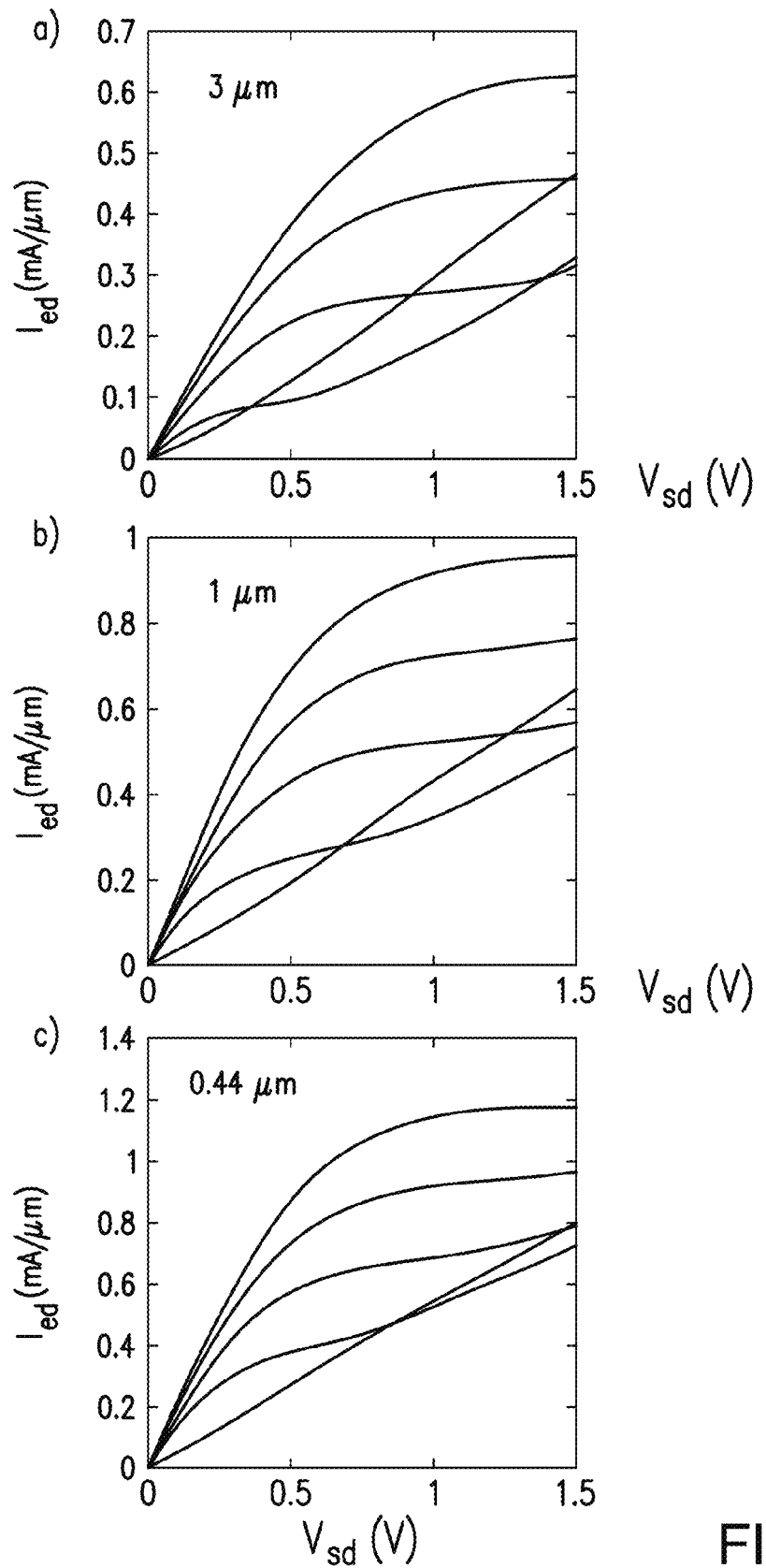
FIG. 12 shows graphs of electrical characteristics of graphene devices according to embodiments of the invention.
Figure 16:
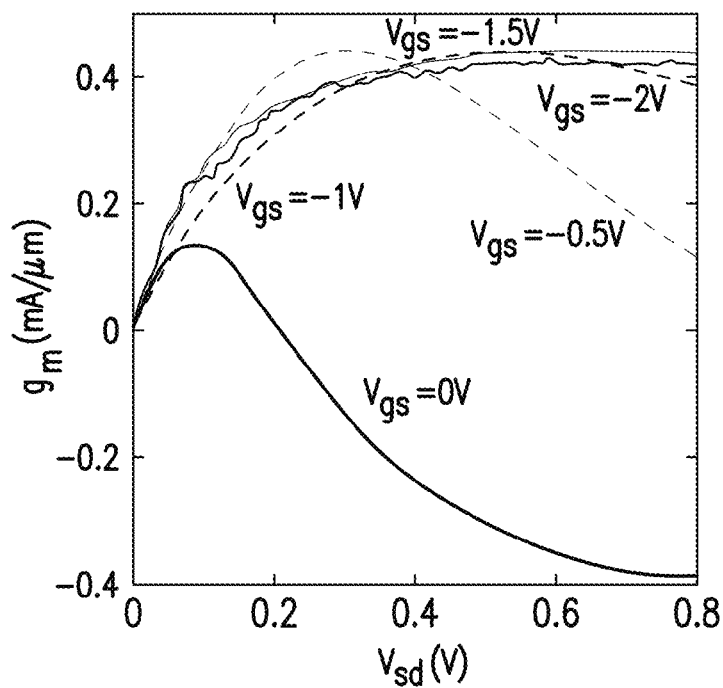
FIG. 16 shows graphs of electrical characteristics of graphene devices according to embodiments of the invention.

FIG. 12 shows the measured I-V characteristics of GFETs of channel lengths 3 µm, 1 µm, and 0.44 µm. In the unipolar regime, $V_{sd} < V_{sd-kink}$ the GFETs show saturating I-V characteristics. Because these devices are still limited by contact resistance, we show the intrinsic device IV characteristic (FIG. 13) after the extraction of the measured contact resistance. The 0.44-µm-channel-length device shows an intrinsic $I_{on}$ of more than 1 mA/µm. FIG. 16 shows the intrinsic trarisconductances for this same 0.44-µm device as a function of $V_{sd}$ for different values of $V_{gs}$. The peak intrinsic transconductance, obtained after the extraction of the contact resistance exceeds 400 mS/mm and is independent of channel lengths (FIG. 14), consistent with velocity-saturation-dominated transport. This value is approximately 2.6 times higher than values on $SiO_2$-supported samples, even though the effective gate capacitance is 30% lower.

Figure 13:
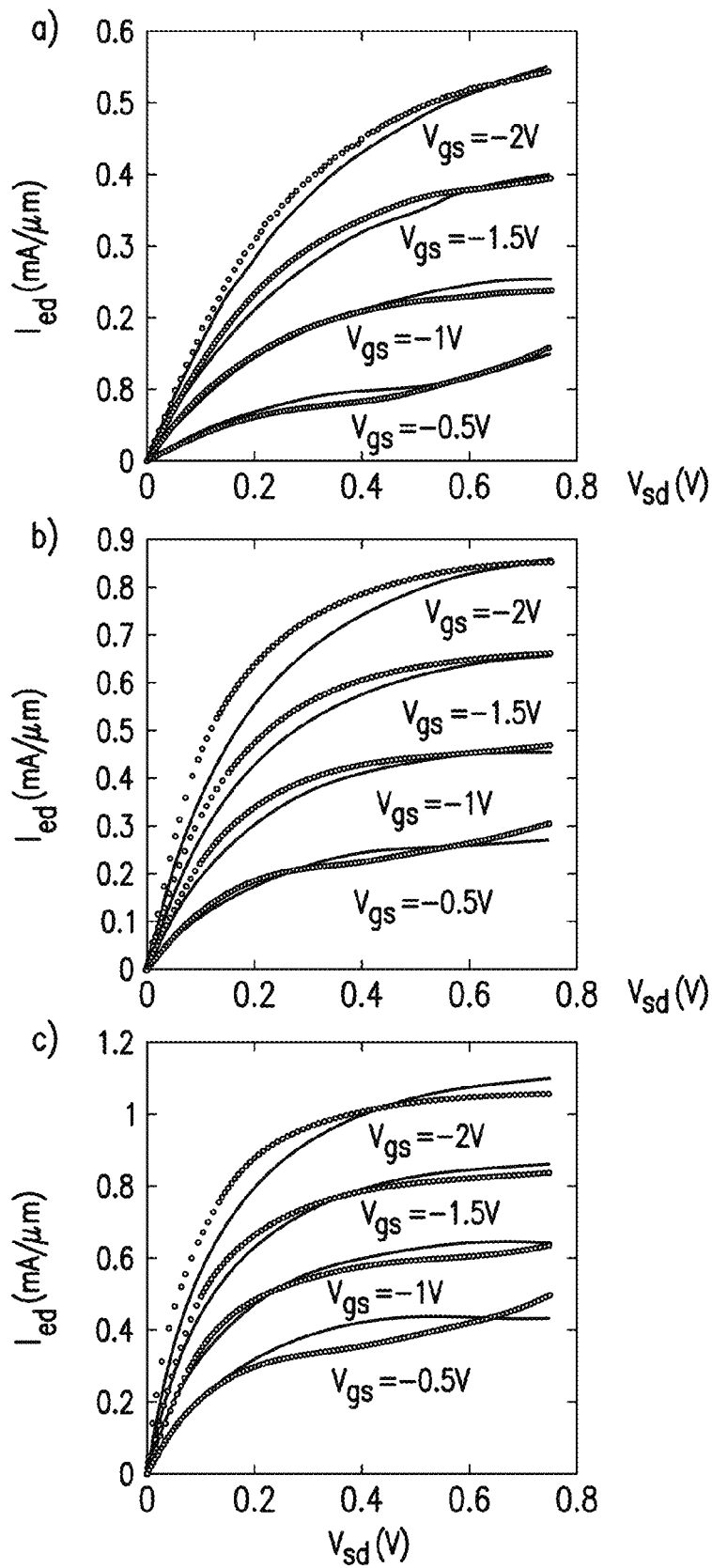
FIG. 13 shows graphs of electrical characteristics of graphene devices according to embodiments of the invention.
Figure 17:
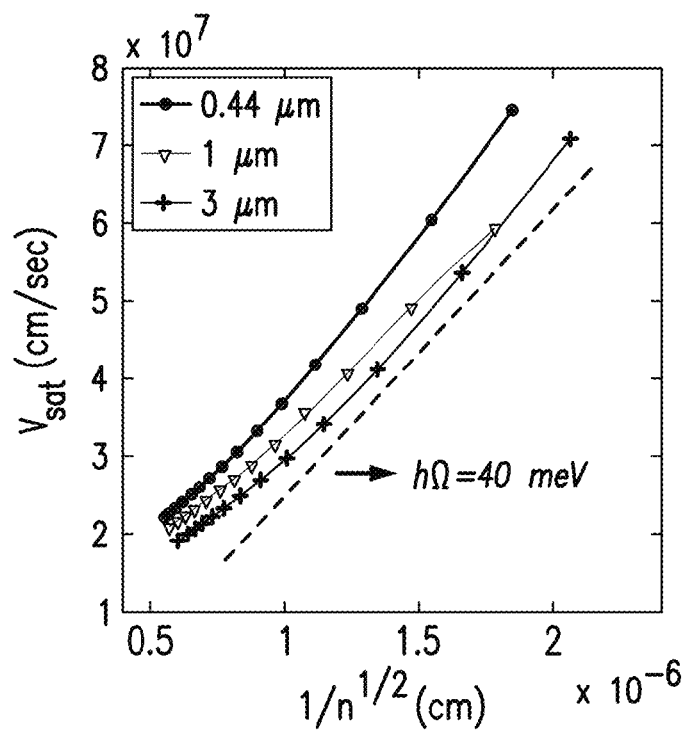
FIG. 17 shows graphs of electrical characteristics of graphene devices according to embodiments of the invention.

FIG. 15 outlines the basic field-effect modeling of the devices (these model fits are shown in FIG. 13). The carrier-dependent saturation velocity ($v_{sat}$) which assumes the simple nonequilibrium Fermi surface shown in FIG. 15a is given by the expression in Eqn. 3, and approaches $v_F$ for $\hbar\Omega \gg E_F$. Furthermore, we explicitly include the density dependence of $v_{sat}$ self-consistently in the current-voltage model. FIG. 17 shows $v_{sat}$ as a function of 1/sqrt(n) (for an overdrive sufficiently large to ensure a unipolar channel) where n is taken at the drain end of the channel. vsat exceeds $1.14 \times 10^7$ cm/sec at sheet densities of more than $4.5 \times 10^{12}$ $cm^{-2}$, more than two times higher than results on $SiO_2$-supported devices with high-κ gate dielectrics. The slope of the curves indicates an optical phonon energy of approximately 40 meV, significantly less than the surface polar optical phonon energy of 100 meV for BN. FIGS. 10-17 are further discussed below:

FIG. 10 shows a back-gated GFET with h-BN gate dielectric. (a) Atomic structure of graphene and hexagonal boron nitride (b) optical micrograph of exfoliated h-BN (c) AFM image of h-BN showing different layer thickness (d) optical image of GFET; (e) schematic of the back-gated device structure in (d).

FIG. 11 shows Low-field transport characteristics of GFET device. R=1/gds at Vds=10 mV as a function of Vgs for W/L=3.4 mm/2.8 mm.

FIG. 12 shows current-voltage characteristics of GFET devices. (a) 3 µm channel length, (b) 1 µm channel length. (c) 0.44 µm channel length for Vgs 2V to 0V in 0.5V steps.

FIG. 13 show intrinsic device IV characteristics. Intrinsic IV curves after the contact resistance extraction from the measured curves of FIG. 3. Channel length of (a) 3 µm; (b) 1 µm; and (c) 0.44 µm. Model fits (solid lines) are shown along with measured data.

Figure 14:
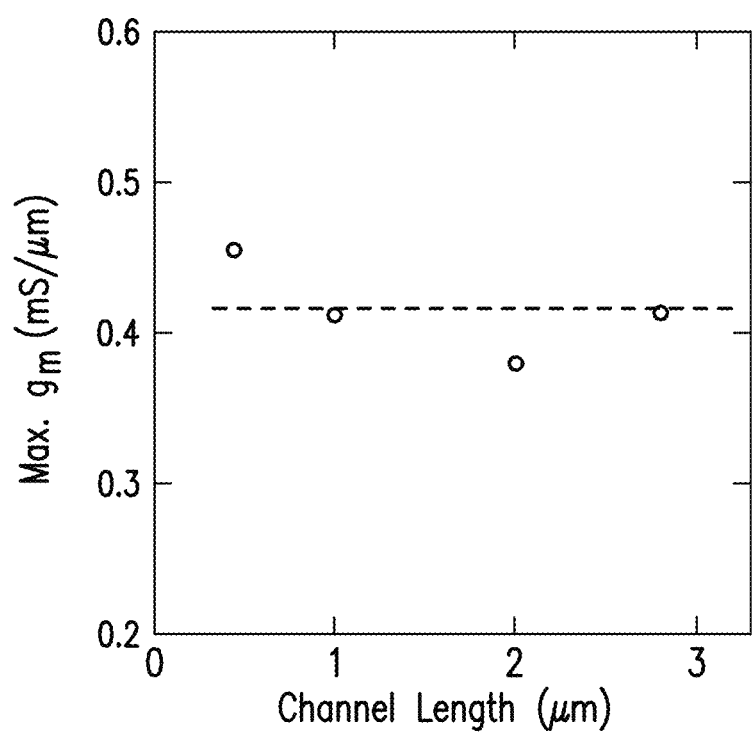
FIG. 14 shows graphs of electrical characteristics of graphene devices according to embodiments of the invention.

FIG. 14 shows maximum intrinsic transconductance (gm) as a function of channel length. The dashed line shows the average value of 415 mS/mm.

FIG. 15 shows GFET Modeling. (a) shows the nonequilibrium Fermi surface used for the modeling (b) equations used for field-effect modeling. E(k) is the complete elliptic integral of the second kind; K(k) is the complete elliptic integral of the first kind.

FIG. 16 shows intrinsic small-signal transconductance (gm) as a function of drain-to-source voltage (Vsd) for 0.44 µm channel length.

FIG. 17 shows saturation velocity plotted versus square root of the drain density for different channel lengths as extracted from the model fits. The dashed line shows a slope corresponding to $h\Omega=40$ meV.

The RF performance of GFETs, as determined by the device current-gain cut-off frequency (fT), has gone from 15 GHz for 500-nm-length devices in the first measurements to 155 GHz at 40-nm channel lengths.

RF measurements for top-gated device structures exhibit current-voltage characteristics that do not show strong current saturation due to relatively poor gate oxide interfaces or weak gate coupling. As a result, device output conductance is high, power gain is limited, and the maximum oscillation frequency ($f_{max}$) is typically only one tenth of $f_T$. In this work, by exploiting high-quality boron nitride dielectrics, we instead find $f_{max}/f_T$ ratios as high as 0.86 and $f_{max}$ values as high as 34 GHz for a 600-nm-length device, the highest value reported so far for GFETs. We further investigate the bias dependence of both $f_T$ and $f_{max}$ and compare our results with small-signal models of our device structures.

Figure 18:
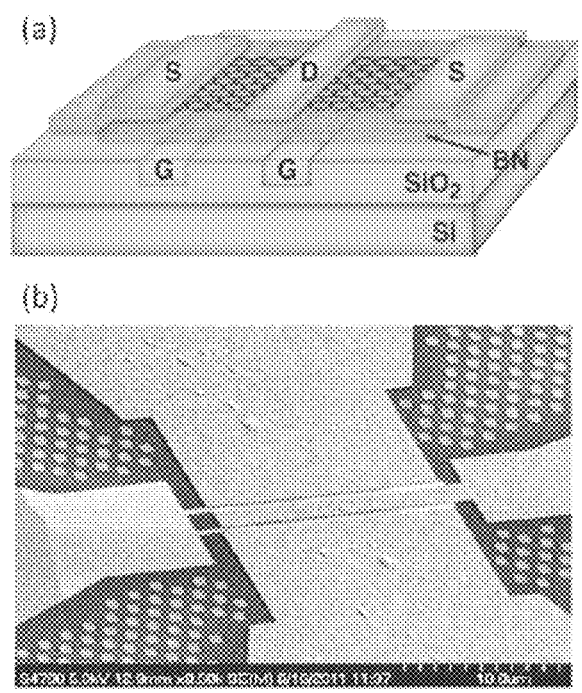
FIG. 18 shows an isometric representation of graphene devices according to embodiments of the invention.

Hexagonal boron nitride (h-BN) can be an outstanding gate dielectric for GFETs, yielding interfaces nearly free of trapped charge and maintaining high mobility and carrier velocities in the graphene channel. The GFETs characterized here are created with a back gate as shown in FIG. 18a. A split-gate layout is employed, where tungsten metal gates are initially patterned into a 1-μm $SiO_2$ layer using a Damascene-like process, followed by a chemical-mechanical polishing (CMP) step to ensure a flat surface and expose the gate metal surface. h-BN (10-μm thick) is mechanically transferred to form the gate dielectric, followed by the mechanical transfer of the graphene channel (single layer). GFET fabrication ends with e-beam patterning of source and drain contacts with approximately 50-nm gate-to-source and gate-to-drain spacings as shown in FIG. 18a. An SEM micrograph of a completed device is shown in FIG. 18b.

Figure 19:
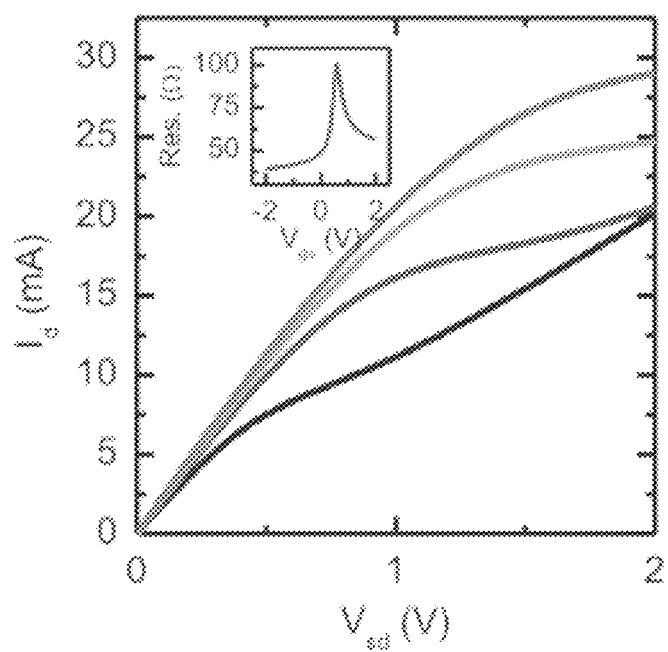
FIG. 19 shows graphs of electrical characteristics of graphene devices according to embodiments of the invention.

FIG. 19 shows the DC current-voltage (IV) characteristic of a representative GFET device with an effective width of approximately 38 μm and channel length of 0.6 μm. The inset of FIG. 19 shows the accompanying source-drain resistance in the triode region at $V_{sd}=10$ mV, from which the contact resistance and low-field mobility can be extracted. The total contact resistance (including both source and drain) is approximately 25Ω, or 950 Ω-μm when normalized to contact width. (Contact resistance is inversely proportional to contact width.) The low-field mobility is 3,300 $cm^2/V$ sec. The charge neutrality point ($V_o$), the gate-to-source voltage at which the maximum low-field triode resistance is achieved, is 0.6 V. IV characteristics are plotted for gate voltages ($V_{sg}$) from 0 to −1.5V, demonstrating both saturating current characteristics for the unipolar hole channel and the "kink" associated with the transition to the ambipolar hole-electron channel.

Figure 20:
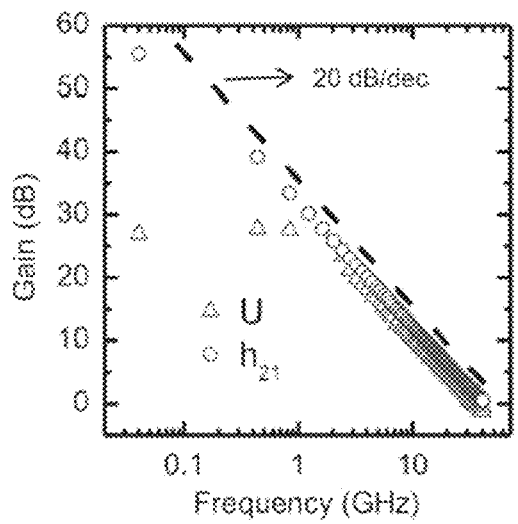
FIG. 20 shows graphs of electrical characteristics of graphene devices according to embodiments of the invention.

Device S-parameters are measured to 40 GHz. Standard "open-short" dc-embedding methods are employed. In FIG. 20, current-gain ($h_{21}$) and unilateral power gain (U) are plotted at the bias point of peak gm, yielding $f_T$ and $f_{max}$ of 44 GHz and 34 GHz, respectively. (Without de-embedding $f_T$ and $f_{max}$ are 24 GHz and 17 GHz, respectively.)

Figure 21:
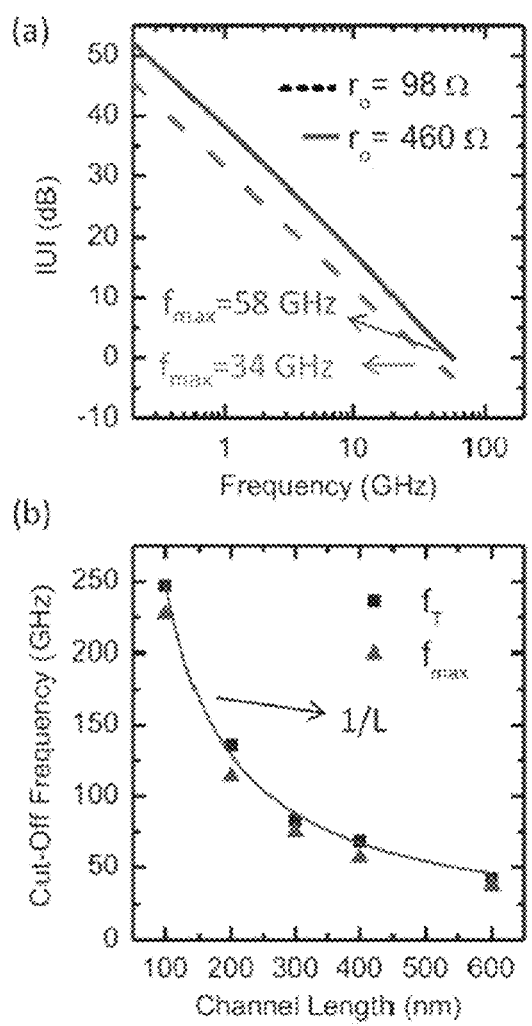
FIG. 21 shows graphs of electrical characteristics of graphene devices according to embodiments of the invention.

FIG. 21a shows how the $f_{max}$ performance could be improved to 58 GHz for this same channel length if the $V_o$ of the device could be adjusted (through a secondary gate or channel doping) to align peak $g_m$ and $r_o$. The model is also used to estimate the performance at shorter channel lengths by scaling gate capacitance while keeping other small-signal parameters constant as shown in FIG. 21b. $f_{max}$ values close to 250 GHz are possible at 100 nm channel length. Higher frequency performance will require significant improvements in device parasitics, most notably the contact resistance.

In the above detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and structural, logical, and electrical changes may be made.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An electronic device comprising:
    a boron nitride surface;
    a graphene layer over the boron nitride surface having a non-zero degree of lattice mismatch causing misalignment; and
    one or more electrical contacts on the graphene layer.

2. The electronic device of claim 1, wherein the one or more electrical contacts include a pair of source/drain regions having a graphene channel region located therebetween, and a gate electrode located adjacent to the graphene channel region to form a transistor.

3. The electronic device of claim 1, wherein the non-zero degree of lattice mismatch includes rotation about a line normal to an interface plane between a lattice in the graphene layer and a lattice in the boron nitride surface.

4. The electronic device of claim 1, wherein the boron nitride surface includes a boron nitride layer over a substrate.

5. The electronic device of claim 2, wherein the gate electrode is below the graphene channel region.

6. The electronic device of claim 5, wherein the gate electrode is separated from the graphene channel region by the boron nitride layer.

7. The electronic device of claim 2, wherein the gate electrode is above the graphene channel region.

8. The electronic device of claim 2, wherein the transistor is formed on a silicon substrate.

9. The electronic device of claim 8, wherein the transistor is formed on an $SiO_2$ layer on the silicon substrate.

* * * * *